United States Patent
Baum et al.

(10) Patent No.: US 11,238,331 B2
(45) Date of Patent: Feb. 1, 2022

(54) SYSTEM AND METHOD FOR AUGMENTING AN EXISTING ARTIFICIAL NEURAL NETWORK

(71) Applicant: Hailo Technologies Ltd., Ra'anana (IL)

(72) Inventors: Avi Baum, Givat Shmuel (IL); Or Danon, Kiryat Ono (IL)

(73) Assignee: Hailo Technologies Ltd.

( * ) Notice: Subject to any disclaimer, the term of this patent is extended or adjusted under 35 U.S.C. 154(b) by 1083 days.

(21) Appl. No.: 15/794,586

(22) Filed: Oct. 26, 2017

(65) Prior Publication Data

US 2018/0285735 A1  Oct. 4, 2018

Related U.S. Application Data

(60) Provisional application No. 62/531,372, filed on Jul. 12, 2017, provisional application No. 62/481,492, filed on Apr. 4, 2017.

(51) Int. Cl.
*G06N 3/04* (2006.01)
*G06F 12/02* (2006.01)
(Continued)

(52) U.S. Cl.
CPC .............. *G06N 3/04* (2013.01); *G06F 5/01* (2013.01); *G06F 7/501* (2013.01); *G06F 7/523* (2013.01);
(Continued)

(58) Field of Classification Search
CPC ............. G06F 12/0207; G06F 12/0646; G06F 12/0692; G06F 30/27; G06F 30/30;
(Continued)

(56) References Cited

U.S. PATENT DOCUMENTS

| 4,450,533 A | 5/1984 | Petit |
|---|---|---|
| 4,943,931 A | 7/1990 | Allen |

(Continued)

FOREIGN PATENT DOCUMENTS

| CA | 2019099 A1 | 12/1990 |
|---|---|---|
| CA | 2002681 A1 | 5/1991 |

(Continued)

OTHER PUBLICATIONS

Principe et al., An Analysis of the Gamma Memory in Dynamic Neural Networks, IEEE Transactions on Neural Networks, vol. 5, No. 2, pp. 331-337, Mar. 1994. (Year: 1994).*
(Continued)

*Primary Examiner* — Brian M Smith
*Assistant Examiner* — Marshall L Werner
(74) *Attorney, Agent, or Firm* — Zaretsky Group PC; Howard Zaretsky

(57) ABSTRACT

A novel and useful augmented artificial neural network (ANN) incorporating an existing artificial neural network (ANN) coupled to a supplemental ANN and a first-in first-out (FIFO) stack for storing historical output values of the network. The augmented ANN exploits the redundant nature of information present in an input data stream. The addition of the supplemental ANN along with a FIFO enables the augmented network to look back into the past in making a decision for the current frame. It provides context aware object presence as well as lowers the rate of false detections and misdetections. The output of the existing ANN is stored in a FIFO to create a lookahead system in which both past output values of the supplemental ANN and 'future' values of the output of the existing ANN are used in making a decision for the current frame. In addition, the mechanism does not require retraining the entire neural network nor does it require data set labeling.

19 Claims, 10 Drawing Sheets

(51) Int. Cl.

| | |
|---|---|
| *G06N 3/063* | (2006.01) |
| *G06F 12/06* | (2006.01) |
| *G06N 20/00* | (2019.01) |
| *G06F 30/30* | (2020.01) |
| *G06F 30/27* | (2020.01) |
| *G06F 7/501* | (2006.01) |
| *G06F 7/523* | (2006.01) |
| *G06F 9/50* | (2006.01) |
| *G06F 17/10* | (2006.01) |
| *G06F 5/01* | (2006.01) |
| *G06N 3/08* | (2006.01) |
| *G06F 13/16* | (2006.01) |
| *G06F 9/30* | (2018.01) |
| *G06K 9/46* | (2006.01) |
| *G06K 9/62* | (2006.01) |
| *G06N 3/02* | (2006.01) |

(52) U.S. Cl.
CPC ........ *G06F 9/30054* (2013.01); *G06F 9/5016* (2013.01); *G06F 9/5027* (2013.01); *G06F 12/0207* (2013.01); *G06F 12/0646* (2013.01); *G06F 12/0692* (2013.01); *G06F 13/1663* (2013.01); *G06F 17/10* (2013.01); *G06F 30/27* (2020.01); *G06F 30/30* (2020.01); *G06K 9/46* (2013.01); *G06K 9/62* (2013.01); *G06N 3/02* (2013.01); *G06N 3/0454* (2013.01); *G06N 3/063* (2013.01); *G06N 3/08* (2013.01); *G06N 3/084* (2013.01); *G06N 20/00* (2019.01); *G06N 3/082* (2013.01); *Y02D 10/00* (2018.01)

(58) Field of Classification Search
CPC . G06F 5/01; G06F 7/501; G06F 7/523; G06F 9/30054; G06F 9/5016; G06F 9/5027; G06F 13/1663; G06F 17/10; G06N 20/00; G06N 3/02; G06N 3/04; G06N 3/0454; G06N 3/063; G06N 3/08; G06N 3/082; G06N 3/084; G05B 13/02; G06K 9/46; G06K 9/62; Y02D 10/00
See application file for complete search history.

(56) References Cited

U.S. PATENT DOCUMENTS

| | | |
|---|---|---|
| 4,979,124 A | 12/1990 | Sachse et al. |
| 4,994,982 A | 2/1991 | Duranton et al. |
| 5,003,490 A | 3/1991 | Castelaz et al. |
| 5,008,833 A | 4/1991 | Agranat et al. |
| 5,014,235 A | 5/1991 | Morton |
| 5,056,037 A | 10/1991 | Eberhardt |
| 5,080,464 A | 1/1992 | Toyoda |
| 5,091,864 A | 2/1992 | Baji et al. |
| 5,148,515 A | 9/1992 | Vassiliadis et al. |
| 5,195,169 A | 3/1993 | Kamiya et al. |
| 5,195,170 A | 3/1993 | Eberhardt |
| 5,257,358 A | 10/1993 | Cohen |
| 5,274,743 A | 12/1993 | Imondi et al. |
| 5,278,945 A | 1/1994 | Basehore et al. |
| 5,293,456 A | 3/1994 | Guez et al. |
| 5,293,459 A | 3/1994 | Duranton et al. |
| 5,297,232 A | 3/1994 | Murphy |
| 5,365,460 A | 11/1994 | Chung |
| 5,367,612 A | 11/1994 | Bozich et al. |
| 5,408,645 A | 4/1995 | Ikeda et al. |
| 5,423,001 A | 6/1995 | Ueda |
| 5,430,830 A | 7/1995 | Frank et al. |
| 5,444,822 A | 8/1995 | Shinohara |
| 5,448,681 A | 9/1995 | Khan |
| 5,450,315 A | 9/1995 | Stefanski |
| 5,465,204 A | 11/1995 | Sekine et al. |
| 5,479,579 A | 12/1995 | Duong et al. |
| 5,485,545 A | 1/1996 | Kojima et al. |
| 5,486,996 A | 1/1996 | Samad et al. |
| 5,493,631 A | 2/1996 | Huang et al. |
| 5,504,839 A | 4/1996 | Mobus |
| 5,519,811 A | 5/1996 | Yoneda et al. |
| 5,521,985 A | 5/1996 | Camp, Jr. et al. |
| 5,533,383 A | 7/1996 | Greene et al. |
| 5,537,513 A | 7/1996 | DeVille |
| 5,583,771 A | 12/1996 | Lynch et al. |
| 5,615,305 A | 3/1997 | Nunally |
| 5,627,943 A | 5/1997 | Yoneda et al. |
| 5,689,622 A | 11/1997 | Higashino et al. |
| 5,704,016 A | 12/1997 | Shigematsu et al. |
| 5,705,956 A | 1/1998 | Neely |
| 5,717,832 A | 2/1998 | Steimle et al. |
| 5,740,325 A | 4/1998 | Wang |
| 5,745,652 A | 4/1998 | Bigus |
| 5,748,849 A | 5/1998 | Gobert |
| 5,796,925 A | 8/1998 | Deville |
| 5,944,841 A | 8/1999 | Christie |
| 5,956,703 A | 9/1999 | Turner et al. |
| 5,978,782 A | 11/1999 | Neely |
| 6,267,298 B1 | 7/2001 | Campbell |
| 6,317,658 B1 | 11/2001 | Vian |
| 6,326,912 B1 | 12/2001 | Fujimori |
| 6,366,236 B1 | 4/2002 | Farmer et al. |
| 6,421,359 B1 | 7/2002 | Bennett et al. |
| 6,434,541 B1 | 8/2002 | Tawel et al. |
| 6,446,238 B1 | 9/2002 | Canestaro et al. |
| 6,493,689 B2 | 12/2002 | Kotoulas et al. |
| 6,523,018 B1 | 2/2003 | Louis et al. |
| 6,529,614 B1 | 3/2003 | Chao et al. |
| 6,539,368 B1 | 3/2003 | Chernikov et al. |
| 6,542,985 B1 | 4/2003 | Johnson et al. |
| 6,567,953 B1 | 5/2003 | Pomerantz |
| 6,578,020 B1 | 6/2003 | Nguyen |
| 6,622,125 B1 | 9/2003 | Cragun et al. |
| 6,629,089 B1 | 9/2003 | Supino |
| 6,665,813 B1 | 12/2003 | Forsman et al. |
| 6,671,832 B1 | 12/2003 | Apisdorf |
| 6,751,529 B1 | 6/2004 | Fouche |
| 6,836,767 B2 | 12/2004 | McBride |
| 6,882,992 B1 | 4/2005 | Werbos |
| 7,069,256 B1 | 6/2006 | Campos |
| 7,082,419 B1 | 7/2006 | Lightowler |
| 7,113,970 B2 | 9/2006 | Chiueh |
| 7,117,045 B2 | 10/2006 | Hittle et al. |
| 7,174,325 B1 | 2/2007 | Ascoli |
| 7,302,619 B1 | 11/2007 | Tompkins et al. |
| 7,308,322 B1 | 12/2007 | Discenzo et al. |
| 7,647,284 B2 | 1/2010 | Prokhorov |
| 8,081,816 B1 | 12/2011 | Irick et al. |
| 8,126,828 B2 | 2/2012 | Snook et al. |
| 8,131,659 B2 | 3/2012 | Xu et al. |
| 8,145,983 B1 | 3/2012 | Chaichanavong |
| 8,321,769 B1 | 11/2012 | Yeo |
| 8,326,782 B2 | 12/2012 | Snook et al. |
| 8,391,306 B2 | 3/2013 | Ito et al. |
| 8,745,466 B2 | 6/2014 | Kaynak |
| 8,892,485 B2 | 11/2014 | Aparin et al. |
| 8,909,576 B2 | 12/2014 | Akopyan et al. |
| 8,996,350 B1 | 3/2015 | Dub |
| 8,996,967 B2 | 3/2015 | Kaynak |
| 9,014,181 B2 | 4/2015 | Lakshman et al. |
| 9,077,491 B2 | 7/2015 | Mar et al. |
| 9,129,220 B2 | 9/2015 | Aparin et al. |
| 9,129,222 B2 | 9/2015 | Aparin |
| 9,153,230 B2 | 10/2015 | Maaninen |
| 9,159,020 B2 | 10/2015 | Alcarez-Icaza Rivera et al. |
| 9,195,656 B2 | 11/2015 | Fructuoso et al. |
| 9,306,965 B1 | 4/2016 | Grossman et al. |
| 9,400,954 B2 | 7/2016 | Modha |
| 9,466,022 B2 | 10/2016 | Alvarez-Icaza Rivera et al. |
| 9,477,925 B2 | 10/2016 | Seide et al. |
| 9,530,092 B2 | 12/2016 | Chatterjee et al. |
| 9,542,642 B2 | 1/2017 | Wood |
| 9,542,643 B2 | 1/2017 | Levin et al. |
| 9,558,444 B2 | 1/2017 | Palmer et al. |

(56) References Cited

U.S. PATENT DOCUMENTS

| | | |
|---|---|---|
| 9,607,217 B2 | 3/2017 | Cetintas et al. |
| 10,019,470 B2 | 7/2018 | Birdwell et al. |
| 10,073,816 B1 | 9/2018 | Lu et al. |
| 10,417,089 B2 | 9/2019 | Oboukhov |
| 10,430,706 B2 | 10/2019 | Henry et al. |
| 10,699,189 B2 | 6/2020 | Lie et al. |
| 10,789,734 B2 | 9/2020 | Pan et al. |
| 10,936,569 B1 | 3/2021 | Baskaran et al. |
| 2002/0112204 A1 | 8/2002 | Biskup et al. |
| 2002/0184556 A1 | 12/2002 | Hashemi |
| 2003/0069516 A1 | 4/2003 | Becker et al. |
| 2003/0115537 A1 | 6/2003 | Boyer et al. |
| 2004/0167418 A1 | 8/2004 | Nguyen et al. |
| 2005/0193357 A1 | 9/2005 | Honary et al. |
| 2005/0256420 A1 | 11/2005 | Noman et al. |
| 2006/0015703 A1 | 1/2006 | Ramchandran |
| 2006/0085558 A1 | 4/2006 | Solomon |
| 2006/0167784 A1 | 7/2006 | Hoffberg |
| 2007/0266277 A1 | 11/2007 | Oyamada |
| 2008/0117220 A1 | 5/2008 | Gorchetchnikov et al. |
| 2009/0276666 A1 | 11/2009 | Haley et al. |
| 2010/0100514 A1 | 4/2010 | Raymond et al. |
| 2010/0205399 A1 | 8/2010 | Bean et al. |
| 2010/0313104 A1 | 12/2010 | Bommena et al. |
| 2010/0317420 A1 | 12/2010 | Hoffberg |
| 2011/0041013 A1 | 2/2011 | Ingimundarson |
| 2012/0179898 A1 | 7/2012 | Betouin et al. |
| 2013/0079842 A1 | 3/2013 | Mokelke et al. |
| 2013/0254892 A1 | 9/2013 | Kaufman |
| 2014/0032457 A1 | 1/2014 | Palmer et al. |
| 2014/0156576 A1 | 6/2014 | Nugent |
| 2014/0344203 A1 | 11/2014 | Ahn |
| 2015/0026104 A1 | 1/2015 | Tambos |
| 2015/0081753 A1 | 3/2015 | Srinivasan |
| 2015/0106311 A1 | 4/2015 | Birdwell et al. |
| 2015/0106317 A1 | 4/2015 | Rangan et al. |
| 2015/0134580 A1 | 5/2015 | Wilson |
| 2015/0170021 A1 | 6/2015 | Lupon et al. |
| 2015/0212861 A1 | 7/2015 | Canoy et al. |
| 2015/0269480 A1 | 9/2015 | Levin et al. |
| 2015/0324690 A1 | 11/2015 | Chilimbi et al. |
| 2015/0324691 A1 | 11/2015 | Dropps et al. |
| 2015/0324692 A1 | 11/2015 | Ritchey et al. |
| 2016/0086077 A1 | 3/2016 | Akopyan et al. |
| 2016/0179434 A1 | 6/2016 | Herrero et al. |
| 2016/0232442 A1 | 8/2016 | Fan et al. |
| 2016/0275398 A1 | 9/2016 | Corvinelli et al. |
| 2016/0321537 A1 | 11/2016 | Akopyan et al. |
| 2016/0335119 A1 | 11/2016 | Merill et al. |
| 2016/0335534 A1 | 11/2016 | Nere et al. |
| 2017/0011288 A1 | 1/2017 | Brothers et al. |
| 2017/0017876 A1 | 1/2017 | Modha |
| 2017/0024644 A1 | 1/2017 | Van Der Made et al. |
| 2017/0090929 A1 | 3/2017 | Muttik et al. |
| 2017/0091614 A1 | 3/2017 | Amir et al. |
| 2017/0093526 A1 | 3/2017 | Mula et al. |
| 2017/0103313 A1 | 4/2017 | Ross et al. |
| 2017/0110093 A1 | 4/2017 | Stein et al. |
| 2017/0206437 A1 | 7/2017 | Hachiya et al. |
| 2017/0330509 A1 | 11/2017 | Cok et al. |
| 2017/0345181 A1* | 11/2017 | Yu .......................... G06T 7/194 |
| 2018/0018558 A1 | 1/2018 | Lee et al. |
| 2018/0189231 A1 | 7/2018 | Fleming |
| 2018/0232617 A1 | 8/2018 | Rozen et al. |
| 2018/0260220 A1 | 9/2018 | Lacy et al. |
| 2018/0322382 A1 | 11/2018 | Mellempudi et al. |
| 2018/0336462 A1 | 11/2018 | Brothers |
| 2018/0375729 A1 | 12/2018 | Tzoreff et al. |
| 2019/0079729 A1 | 3/2019 | Aimone |
| 2019/0158223 A1 | 5/2019 | Carlough et al. |
| 2019/0197350 A1 | 6/2019 | Park |
| 2019/0373588 A1 | 12/2019 | Bae |
| 2020/0154482 A1 | 5/2020 | Ahn |
| 2020/0193297 A1 | 6/2020 | Verhoef |
| 2020/0202198 A1 | 6/2020 | Lee et al. |
| 2020/0024496 A1 | 7/2020 | Bhorkar |
| 2020/0285950 A1 | 9/2020 | Baum et al. |
| 2020/0285997 A1 | 9/2020 | Bhattacharyya |
| 2020/0322135 A1 | 10/2020 | Kupwade Patil |
| 2020/0379841 A1 | 12/2020 | Cassidy et al. |
| 2021/0053574 A1 | 2/2021 | Bielby et al. |
| 2021/0073127 A1 | 3/2021 | Bielby et al. |
| 2021/0132678 A1 | 5/2021 | An |
| 2021/0158169 A1 | 5/2021 | Kim |

FOREIGN PATENT DOCUMENTS

| | | |
|---|---|---|
| CA | 2383318 A1 | 10/2003 |
| CA | 2927171 A1 | 7/2016 |
| CN | 101452258 | 6/2009 |
| CN | 101493677 | 7/2009 |
| CN | 101809597 | 8/2010 |
| CN | 201927073 | 8/2011 |
| CN | 101882238 | 2/2012 |
| CN | 102490120 | 6/2012 |
| CN | 103778468 | 5/2014 |
| CN | 104107507 | 10/2014 |
| CN | 104459064 | 3/2015 |
| CN | 104493826 | 4/2015 |
| CN | 104899641 | 9/2015 |
| CN | 105184366 | 12/2015 |
| CN | 105260776 | 1/2016 |
| CN | 105311750 | 2/2016 |
| CN | 105653790 | 6/2016 |
| CN | 105676649 | 6/2016 |
| CN | 105678379 | 6/2016 |
| CN | 105844330 | 8/2016 |
| CN | 105930902 | 9/2016 |
| CN | 106022468 | 10/2016 |
| CN | 106355246 | 1/2017 |
| CN | 106447034 | 2/2017 |
| CN | 106503796 | 3/2017 |
| CN | 106529670 | 3/2017 |
| DE | 4310279 A1 | 10/1993 |
| DE | 19718224 A1 | 11/1997 |
| EP | 388806 A2 | 9/1990 |
| EP | 575716 A1 | 12/1993 |
| EP | 411761 B1 | 4/1996 |
| EP | 370543 B1 | 1/1997 |
| EP | 568146 B1 | 11/1997 |
| EP | 465241 B1 | 11/1998 |
| EP | 525543 B1 | 1/1999 |
| EP | 2825974 A1 | 1/2015 |
| EP | 3035249 | 6/2016 |
| EP | 3276540 | 1/2018 |
| FR | 2724029 B1 | 12/1997 |
| FR | 2780919 B1 | 5/2002 |
| GB | 2245401 | 1/1992 |
| GB | 2351885 | 1/2001 |
| JP | 2157832 | 6/1990 |
| JP | 2206867 | 8/1990 |
| JP | 2207369 | 8/1990 |
| JP | 2267660 | 11/1990 |
| JP | 2292602 | 12/1990 |
| JP | 3100857 | 4/1991 |
| JP | 3276137 | 12/1991 |
| JP | 4040581 | 2/1992 |
| JP | 4113481 | 4/1992 |
| JP | 4148212 | 5/1992 |
| JP | 4182769 | 6/1992 |
| JP | 4237388 | 8/1992 |
| JP | 4264664 | 9/1992 |
| JP | 4328691 | 11/1992 |
| JP | 4336370 | 11/1992 |
| JP | 4344970 | 12/1992 |
| JP | 5020294 | 1/1993 |
| JP | 5067064 | 3/1993 |
| JP | 5081227 | 4/1993 |
| JP | 5128284 | 5/1993 |
| JP | 5128285 | 5/1993 |
| JP | 5159087 | 6/1993 |
| JP | 5165800 | 7/1993 |
| JP | 5165987 | 7/1993 |
| JP | 5181547 | 7/1993 |

(56) References Cited

FOREIGN PATENT DOCUMENTS

| | | |
|---|---|---|
| JP | 5197701 | 8/1993 |
| JP | 5282272 | 10/1993 |
| JP | 5334278 | 12/1993 |
| JP | 5346914 | 12/1993 |
| JP | 6019868 | 1/1994 |
| JP | 6076092 | 3/1994 |
| JP | 6161586 | 6/1994 |
| JP | 7005904 | 1/1995 |
| JP | 7105165 | 4/1995 |
| JP | 7160796 | 6/1995 |
| JP | H07191951 | 7/1995 |
| JP | 7302292 | 11/1995 |
| JP | 8161282 | 6/1996 |
| JP | 9026948 | 1/1997 |
| JP | 2000322400 | 11/2000 |
| JP | 2001034735 | 2/2001 |
| JP | 03177996 B2 | 6/2001 |
| JP | 2006154992 | 6/2006 |
| JP | 2009288908 | 12/2009 |
| JP | 2015195011 | 11/2015 |
| JP | 2016153984 | 8/2016 |
| JP | 201619011 | 12/2016 |
| KR | 2001095960 | 11/2001 |
| KR | 367715 B1 | 1/2003 |
| KR | 2005042871 | 5/2005 |
| KR | 919572 B1 | 10/2009 |
| RU | 2057363 C1 | 3/1996 |
| RU | 2473126 C1 | 1/2013 |
| RU | 2602973 C1 | 11/2016 |
| UA | 96148 C2 | 10/2011 |
| WO | WO 1991019267 A1 | 12/1991 |
| WO | WO 1993/023814 A1 | 11/1993 |
| WO | WO 1996041277 A1 | 12/1996 |
| WO | WO 2005/051189 A2 | 6/2005 |
| WO | WO 2007/033101 A2 | 3/2007 |
| WO | WO 2012/006468 A1 | 1/2012 |
| WO | WO 2015/157013 A1 | 10/2015 |
| WO | WO 2015/193531 A1 | 12/2015 |
| WO | WO 2016/099779 A1 | 6/2016 |
| WO | WO 2016/186811 A1 | 11/2016 |
| WO | WO 2018/126270 A1 | 7/2018 |

OTHER PUBLICATIONS

Campolucci et al., On-Line Learning Algorithms for Locally Recurrent Neural Networks, IEEE Transactions on Neural Networks, vol. 10, No. 2, pp. 252-271, Mar. 1999. (Year: 1999).*

Narendra et al., Identification and Control of Dynamical Systems Using Neural Networks, IEEE Transactions on Neural Networks, vol. 1, No. 1, pp. 4-27, Mar. 1990. (Year: 1990).*

ISR/WO dated Jun. 24, 2018; issued in connection with PCT/IL2018/050392.

ISR/WO dated Jul. 10, 2018; issued in connection with PCT/IL2018/050393.

ISR/WO dated Jul. 12, 2018; issued in connection with PCT/IL2018/050394.

ISR/WO dated Jul. 11, 2018; issued in connection with PCT/IL2018/050395.

ISR/WO dated Jul. 15, 2018; issued in connection with PCT/IL2018/050396.

Khan M et al, SpiNNaker: Mapping neural networks onto a massively-parallel chip multiprocessor, Neural Networks, 2008, pp. 2849-2856.

Carillo et al., Hierarchical network-on-chip and traffic ompression . . . , 2012 IEEE, p. 83-90.

Yihua Liao: Neural Networks in Hardware: A Survey (undated).

M'zah et al., "Deterministic Microcode Machine Generation", 2017 IEEE Conference on Dependable and Secure Computing, 2017, pp. 370-376, doi: 10.1109/DESEC.2017.8073858. (Year: 2017).

Shuchang Zhou et al., "Balanced Quantization: An Effective and Efficient Approach to Quantized Neural Networks", arXiv, Jun. 2017 (Year: 2017).

Lin, "Fixed Point Quantization of Deep Convolutional Networks", Proceedings of the 33rd International Conference on Machine Learning, New York, NY, JMLR: W&CP vol. 48, arXiv, Jun. 2016 (Year: 2016).

Amir et al., "Cognitive Computing Programming Paradigm: A Corelet Language for Composing Networks of Neurosynaptic Cores", Aug. 4-9, 2013, The 2013 International Joint Conference on Neural Networks (IJCNN), IEEE (Rear: 2013).

George et al.,MicroPython 1.14 [Online}, Aug. 2015 [retrived on Mar. 16, 2021], Retrieved from the Internet:,URL: http://docs.micropython.org/en/latest/pyboard/tutorial/assembler.html. (Year: 2015).

Pattnaik et al., "Scheduling Techniques for GPU Architectures with Processing-In_Memory Capabilities", Sep. 11-15, 2016, IEEE, p. 31-44 (Year: 2016).

Zhu et al., "Flow-Guided Feature Aggregation for Video Object Detection", Arxiv Technology Report, arXiv:1703.10025v2 [cs.CV], Aug. 2017.

* cited by examiner

SYSTEM AND METHOD FOR AUGMENTING AN EXISTING ARTIFICIAL NEURAL NETWORK

REFERENCE TO PRIORITY APPLICATIONS

This application claims the benefit of U.S. Provisional Application No. 62/481,492, filed Apr. 4, 2017, entitled "Multi-Layer Artificial Neural Network Computation Engine and Microarchitecture," and U.S. Provisional Application No. 62/531,372, filed Jul. 12, 2017, entitled "Multi-Layer Artificial Neural Network Computation Engine and Microarchitecture," both of which are incorporated herein by reference in their entirety.

FIELD OF THE DISCLOSURE

The subject matter disclosed herein relates to the field of neural networks and more particularly relates to a system and method for augmenting an existing artificial neural network (ANN) with an additional layer incorporating a supplemental ANN.

BACKGROUND OF THE INVENTION

Artificial neural networks (ANNs) are computing systems inspired by the biological neural networks that constitute animal brains. Such systems learn, i.e. progressively improve performance, to do tasks by considering examples, generally without task-specific programming. For example, in image recognition, they might learn to identify images that contain cats by analyzing example images that have been manually labeled as "cat" or "not cat" and using the analytic results to identify cats in other images. They have found most use in applications difficult to express in a traditional computer algorithm using rule-based programming.

An ANN is based on a collection of connected units called artificial neurons, analogous to axons in a biological brain. Each connection or synapse between neurons can transmit a signal to another neuron. The receiving or postsynaptic neuron can process the signals and then signal downstream neurons connected to it. Neurons may have a state, generally represented by real numbers, typically between 0 and 1. Neurons and synapses may also have a weight that varies as learning proceeds, which can increase or decrease the strength of the signal that it sends downstream. Further, they may have a threshold such that only if the aggregate signal is below or above that level is the downstream signal sent.

Typically, neurons are organized in layers. Different layers may perform different kinds of transformations on their inputs. Signals travel from the first, i.e. input, to the last, i.e. output, layer, possibly after traversing the layers multiple times.

The original goal of the neural network approach was to solve problems in the same way that a human brain would. Over time, attention focused on matching specific mental abilities, leading to deviations from biology such as backpropagation, or passing information in the reverse direction and adjusting the network to reflect that information.

The components of an artificial neural network include (1) neurons having an activation threshold; (2) connections and weights for transferring the output of a neuron; (3) a propagation function to compute the input to a neuron from the output of predecessor neurons; and (4) a learning rule which is an algorithm that modifies the parameters of the neural network in order for a given input to produce a desired outcome which typically amounts to modifying the weights and thresholds.

Given a specific task to solve, and a class of functions F, learning entails using a set of observations to find the function that which solves the task in some optimal sense. A cost function C is defined such that, for the optimal solution no other solution has a cost less than the cost of the optimal solution).

The cost function C is a measure of how far away a particular solution is from an optimal solution to the problem to be solved. Learning algorithms search through the solution space to find a function that has the smallest possible cost.

A neural network can be trained using backpropagation which is a method to calculate the gradient of the loss function with respect to the weights in an ANN.

The weight updates of backpropagation can be done via well-known stochastic gradient descent techniques. Note that the choice of the cost function depends on factors such as the learning type (e.g., supervised, unsupervised, reinforcement) and the activation function.

There are three major learning paradigms and each corresponds to a particular learning task: supervised learning, unsupervised learning, and reinforcement learning.

Supervised learning uses a set of example pairs and the goal is to find a function in the allowed class of functions that matches the examples. A commonly used cost is the mean-squared error, which tries to minimize the average squared error between the network's output and the target value over all example pairs. Minimizing this cost using gradient descent for the class of neural networks called multilayer perceptrons (MLP), produces the backpropagation algorithm for training neural networks. Examples of supervised learning include pattern recognition, i.e. classification, and regression, i.e. function approximation.

In unsupervised learning, some data is given and the cost function to be minimized can be any function of the data and the network's output. The cost function is dependent on the task (i.e. the model domain) and any a priori assumptions (i.e. the implicit properties of the model, its parameters, and the observed variables). Tasks that fall within the paradigm of unsupervised learning are in general estimation problems; the applications include clustering, the estimation of statistical distributions, compression, and filtering.

In reinforcement learning, data is usually not provided, but generated by an agent's interactions with the environment. At each point in time, the agent performs an action and the environment generates an observation and an instantaneous cost according to some typically unknown dynamics. The aim is to discover a policy for selecting actions that minimizes some measure of a long-term cost, e.g., the expected cumulative cost. The environment's dynamics and the long-term cost for each policy are usually unknown, but can be estimated.

Today, a common application for neural networks is in the analysis of video streams, i.e. machine vision. Examples include industrial factories where machine vision is used on the assembly line in the manufacture of goods, autonomous vehicles where machine vision is used to detect objects in the path of and surrounding the vehicle, etc.

A typical video stream, however, carries a great deal of entropy (i.e. information redundancy) owing to the inherent dependency across consecutive frames and the massive amount of redundant information. This characteristic of video data is well exploited by a variety of well-known algorithms, especially data compression algorithms such as H.264 compression in the MPEG-4 standard.

In addition, existing ANNs typically operate on static images, e.g., frame by frame in the context of a video feed, in a manner that is inexpensive in both computation hardware and memory requirements. These systems, however, do not take history into account in computing the current output of the network. Thus, redundant data in consecutive frames is not exploited.

There is thus a need for an ANN that exploits the historical information naturally present in the input data, e.g., video stream. In addition, there is a need for a mechanism that can augment an existing ANN to take advantage of the historical information in the input feed without requiring any changes to the existing ANN or it's training set.

SUMMARY OF THE INVENTION

The present invention is a system and method of augmenting an existing artificial neural network (ANN) with an additional layer incorporating a supplemental (ANN). The supplemental ANN is configured to take advantage of the redundant information present in many types of input data. For example, consecutive video frames in an input video stream do not change that much from one frame to the next. The supplemental ANN takes advantage of this fact to analyze current data generated by the existing ANN as well as historical data generated by the supplemental ANN in computing an output for the system as a whole.

The invention leverages the information that lies in a video by accounting for the overall context and the time-domain information, using artificial neural networks while avoiding the need for training a frame-by-frame model. This is achieved by adding a first-in first-out (FIFO) stack that holds the history of insights retrieved from a properly trained ANN that operates frame-by-frame and by applying an identity mapping ANN whose inputs are the information history records.

Both causal as well as lookahead embodiments are provided. The causal embodiment uses previous output of the supplemental ANN thus establishing a causal system. The lookahead embodiment uses both 'future' output of the existing ANN as well as past output of the supplemental ANN in making a decision for the current input. 'Future' output of the existing ANN is generated by storing past output values of the existing ANN. This lookahead feature intentionally introduces latency into the final output of the system but for systems that are not sensitive to latency, this provides a more robust output than causal systems.

This, additional, and/or other aspects and/or advantages of the embodiments of the present invention are set forth in the detailed description which follows; possibly inferable from the detailed description; and/or learnable by practice of the embodiments of the present invention.

There is thus provided in accordance with the invention, an apparatus for augmenting an existing artificial neural network (ANN), comprising a supplemental artificial neural network coupled to a first output of the existing ANN, the supplemental ANN operative to generate a second output therefrom, a plurality of shift registers operative to receive the second output from the supplemental ANN and to generate a plurality of historical values of the second output therefrom, and wherein the supplemental ANN is configured to receive as input the first output of the existing ANN and the plurality of historical values of the second output.

There is also provided in accordance with the invention, a method of augmenting an existing artificial neural network (ANN), comprising providing a supplemental artificial neural network coupled to a first output of the existing ANN, generating a second output from the supplemental ANN, generating a plurality of historical values of the second output of the supplemental ANN, and wherein the supplemental ANN is configured to receive as input the first output of the existing ANN and the plurality of historical values of the second output.

There is further provided in accordance with the invention, an apparatus for augmenting an existing artificial neural network (ANN), comprising a supplemental artificial neural network coupled to a first output of the existing ANN, the supplemental ANN operative to generate a second output therefrom, a first plurality of shift registers operative to receive a first output of the existing ANN and to generate a first plurality of historical values thereof, a second plurality of shift registers operative to receive the second output from the supplemental ANN and to generate a second plurality of historical values of the second output therefrom, and wherein the supplemental ANN is configured to receive as input the first output of the existing ANN, the first plurality of historical values of the first output, and the second plurality of historical values of the second output.

There is also provided in accordance with the invention, a method of augmenting an existing artificial neural network (ANN), comprising providing a supplemental artificial neural network coupled to a first output of the existing ANN, generating a second output from the supplemental ANN, generating a first plurality of historical values of the first output of the existing ANN, generating a second plurality of historical values of the second output of the supplemental ANN, and wherein the supplemental ANN is configured to receive as input the first output of the existing ANN, the first plurality of historical values of the first output, and the second plurality of historical values of the second output.

There is further provided in accordance with the invention, a method for use with an existing artificial neural network (ANN), comprising augmenting the existing ANN with an additional layer that includes a supplemental ANN, generating a plurality of historical values of an output of the supplemental ANN, and utilizing the historical values along with an output of the existing ANN to generate the supplemental ANN output.

There is also provided in accordance with the invention, a method for use with an existing artificial neural network (ANN), comprising augmenting the existing ANN with an additional layer that includes a supplemental ANN, generating a first set of historical values of an output of the existing ANN to provide a delayed version of the output of the existing ANN thereby creating future values of the output of the existing ANN, generating a second set of historical values of an output of the supplemental ANN thereby creating past values of the output of the supplemental ANN, and utilizing the past values of the output of the supplemental ANN and the future values of the output of the existing ANN to generate the supplemental ANN output.

BRIEF DESCRIPTION OF THE DRAWINGS

The present invention is explained in further detail in the following exemplary embodiments and with reference to the figures, where identical or similar elements may be partly indicated by the same or similar reference numerals, and the features of various exemplary embodiments being combinable. The invention is herein described, by way of example only, with reference to the accompanying drawings, wherein.

DETAILED DESCRIPTION

Figure 1:
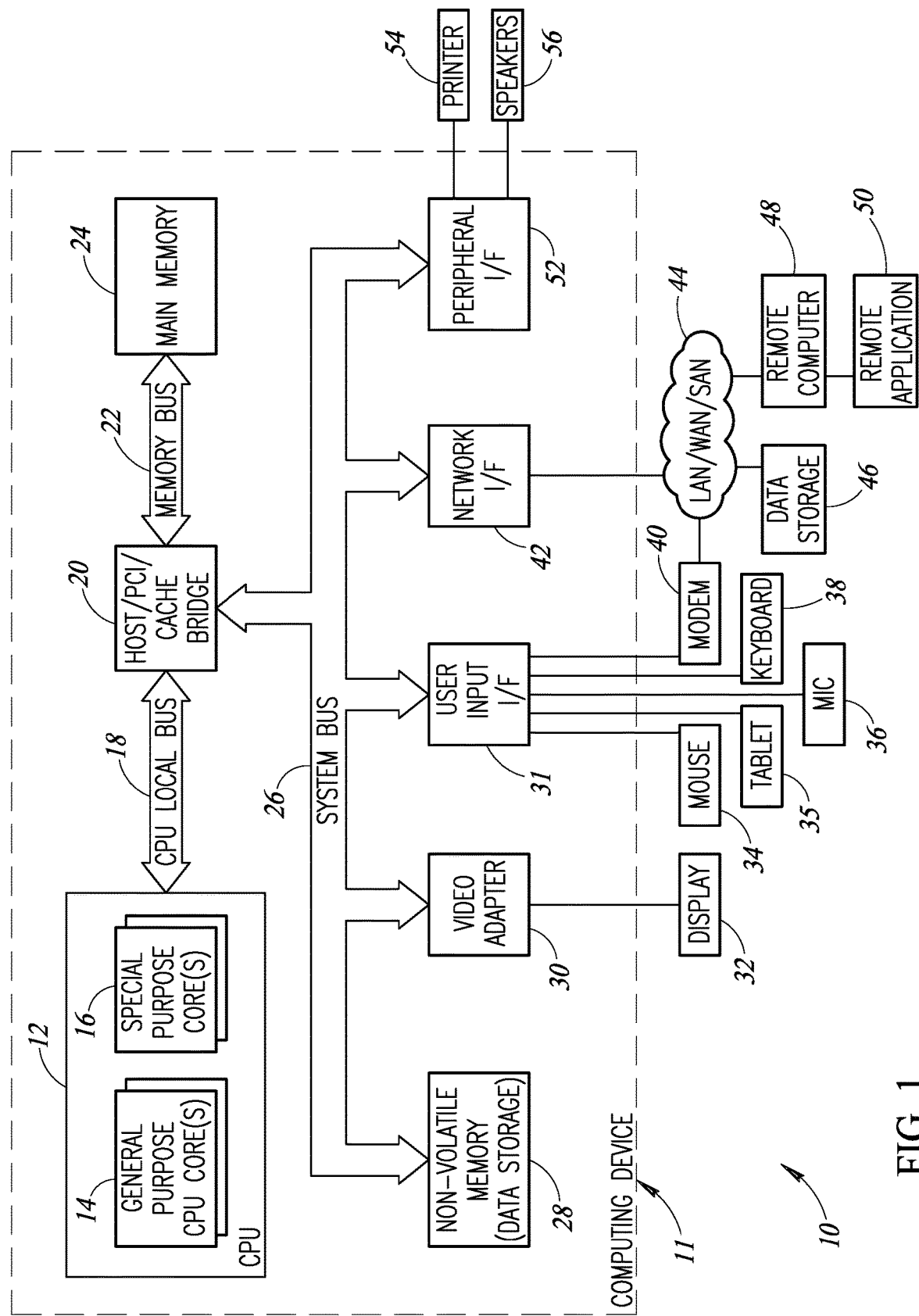
FIG. 1 is a block diagram illustrating an example computer processing system adapted to implement one or more portions of the present invention.

In the following detailed description, numerous specific details are set forth in order to provide a thorough understanding of the invention. It will be understood by those skilled in the art, however, that the present invention may be practiced without these specific details. In other instances, well-known methods, procedures, and components have not been described in detail so as not to obscure the present invention.

Among those benefits and improvements that have been disclosed, other objects and advantages of this invention will become apparent from the following description taken in conjunction with the accompanying figures. Detailed embodiments of the present invention are disclosed herein; however, it is to be understood that the disclosed embodiments are merely illustrative of the invention that may be embodied in various forms. In addition, each of the examples given in connection with the various embodiments of the invention which are intended to be illustrative, and not restrictive.

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings.

The figures constitute a part of this specification and include illustrative embodiments of the present invention and illustrate various objects and features thereof. Further, the figures are not necessarily to scale, some features may be exaggerated to show details of particular components. In addition, any measurements, specifications and the like shown in the figures are intended to be illustrative, and not restrictive. Therefore, specific structural and functional details disclosed herein are not to be interpreted as limiting, but merely as a representative basis for teaching one skilled in the art to variously employ the present invention. Further, where considered appropriate, reference numerals may be repeated among the figures to indicate corresponding or analogous elements.

Because the illustrated embodiments of the present invention may for the most part, be implemented using electronic components and circuits known to those skilled in the art, details will not be explained in any greater extent than that considered necessary, for the understanding and appreciation of the underlying concepts of the present invention and in order not to obfuscate or distract from the teachings of the present invention.

Any reference in the specification to a method should be applied mutatis mutandis to a system capable of executing the method. Any reference in the specification to a system should be applied mutatis mutandis to a method that may be executed by the system.

Throughout the specification and claims, the following terms take the meanings explicitly associated herein, unless the context clearly dictates otherwise. The phrases "in one embodiment," "in an example embodiment," and "in some embodiments" as used herein do not necessarily refer to the same embodiment(s), though it may. Furthermore, the phrases "in another embodiment," "in an alternative embodiment," and "in some other embodiments" as used herein do not necessarily refer to a different embodiment, although it may. Thus, as described below, various embodiments of the invention may be readily combined, without departing from the scope or spirit of the invention.

In addition, as used herein, the term "or" is an inclusive "or" operator, and is equivalent to the term "and/or," unless the context clearly dictates otherwise. The term "based on" is not exclusive and allows for being based on additional factors not described, unless the context clearly dictates otherwise. In addition, throughout the specification, the meaning of "a," "an," and "the" include plural references. The meaning of "in" includes "in" and "on."

As will be appreciated by one skilled in the art, the present invention may be embodied as a system, method, computer program product or any combination thereof. Accordingly, the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, the present invention may take the form of a computer program product embodied in any tangible medium of expression having computer usable program code embodied in the medium.

The invention may be described in the general context of computer-executable instructions, such as program modules, being executed by a computer. Generally, program modules include routines, programs, objects, components, data structures, etc. that perform particular tasks or implement particular abstract data types. The invention may also be practiced in distributed computing environments where tasks are performed by remote processing devices that are linked through a communications network. In a distributed computing environment, program modules may be located in both local and remote computer storage media including memory storage devices.

Any combination of one or more computer usable or computer readable medium(s) may be utilized. The computer-usable or computer-readable medium may be, for example but not limited to, an electronic, magnetic, optical, electromagnetic, infrared, or semiconductor system, apparatus, device, or propagation medium. More specific examples (a non-exhaustive list) of the computer-readable medium would include the following: an electrical connection having one or more wires, a portable computer diskette, a hard disk, a random access memory (RAM), a read-only memory (ROM), an erasable programmable read-only memory (EPROM or flash memory), an optical fiber, a portable compact disc read-only memory (CDROM), an optical storage device, a transmission media such as those supporting the Internet or an intranet, or a magnetic storage device. Note that the computer-usable or computer-readable medium could even be paper or another suitable medium upon which the program is printed, as the program can be electronically captured, via, for instance, optical scanning of the paper or other medium, then compiled, interpreted, or otherwise processed in a suitable manner, if necessary, and then stored in a computer memory. In the context of this document, a computer-usable or computer-readable medium may be any medium that can contain or store the program for use by or in connection with the instruction execution system, apparatus, or device.

Computer program code for carrying out operations of the present invention may be written in any combination of one or more programming languages, including an object-oriented programming language such as Java, Smalltalk, C++, C# or the like, conventional procedural programming languages, such as the "C" programming language, and functional programming languages such as Prolog and Lisp, machine code, assembler or any other suitable programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network using any type of network protocol, including for example a local area network (LAN) or a wide area network (WAN), or the connection may be made to an external computer (for example, through the Internet using an Internet Service Provider).

The present invention is described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented or supported by computer program instructions. These computer program instructions may be provided to a processor of a general-purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer-readable medium that can direct a computer or other programmable data processing apparatus to function in a particular manner, such that the instructions stored in the computer-readable medium produce an article of manufacture including instruction means which implement the function/act specified in the flowchart and/or block diagram block or blocks.

The computer program instructions may also be loaded onto a computer or other programmable data processing apparatus to cause a series of operational steps to be performed on the computer or other programmable apparatus to produce a computer implemented process such that the instructions which execute on the computer or other programmable apparatus provide processes for implementing the functions/acts specified in the flowchart and/or block diagram block or blocks.

The invention is operational with numerous general purpose or special purpose computing system environments or configurations. Examples of well-known computing systems, environments, and/or configurations that may be suitable for use with the invention include, but are not limited to, personal computers, server computers, cloud computing, hand-held or laptop devices, multiprocessor systems, microprocessor, microcontroller or microcomputer based systems, set top boxes, programmable consumer electronics, ASIC or FPGA core, DSP core, network PCs, minicomputers, mainframe computers, distributed computing environments that include any of the above systems or devices, and the like.

In addition, the invention is operational in systems incorporating video and still cameras, sensors, etc. such as found in automated factories, autonomous vehicles, in mobile devices such as tablets and smartphones, smart meters installed in the power grid and control systems for robot networks. In general, any computation device that can host an agent can be used to implement the present invention.

A block diagram illustrating an example computer processing system adapted to implement one or more portions of the present invention is shown in FIG. 1. The exemplary computer processing system, generally referenced 10, for implementing the invention comprises a general-purpose computing device 11. Computing device 11 comprises central processing unit (CPU) 12, host/PIC/cache bridge 20 and main memory 24.

The CPU 12 comprises one or more general purpose CPU cores 14 and optionally one or more special purpose cores 16 (e.g., DSP core, floating point, GPU, and neural network optimized core). The one or more general purpose cores execute general purpose opcodes while the special purpose cores execute functions specific to their purpose. The CPU 12 is coupled through the CPU local bus 18 to a host/PCI/cache bridge or chipset 20. A second level (i.e. L2) cache memory (not shown) may be coupled to a cache controller in the chipset. For some processors, the external cache may comprise an L1 or first level cache. The bridge or chipset 20 couples to main memory 24 via memory bus 22. The main memory comprises dynamic random access memory (DRAM) or extended data out (EDO) memory, or other types of memory such as ROM, static RAM, flash, and non-volatile static random access memory (NVSRAM), bubble memory, etc.

The computing device 11 also comprises various system components coupled to the CPU via system bus 26 (e.g., PCI). The host/PCI/cache bridge or chipset 20 interfaces to the system bus 26, such as peripheral component interconnect (PCI) bus. The system bus 26 may comprise any of several types of well-known bus structures using any of a variety of bus architectures. Example architectures include Industry Standard Architecture (ISA) bus, Micro Channel Architecture (MCA) bus, Enhanced ISA (EISA) bus, Video Electronics Standards Associate (VESA) local bus and Peripheral Component Interconnect (PCI) also known as Mezzanine bus.

Various components connected to the system bus include, but are not limited to, non-volatile memory (e.g., disk based data storage) 28, video/graphics adapter 30 connected to display 32, user input interface (I/F) controller 31 connected to one or more input devices such mouse 34, tablet 35, microphone 36, keyboard 38 and modem 40, network interface controller 42, peripheral interface controller 52 connected to one or more external peripherals such as printer 54 and speakers 56. The network interface controller 42 is coupled to one or more devices, such as data storage 46, remote computer 48 running one or more remote applications 50, via a network 44 which may comprise the Internet cloud, a local area network (LAN), wide area network (WAN), storage area network (SAN), etc. A small computer systems interface (SCSI) adapter (not shown) may also be coupled to the system bus. The SCSI adapter can couple to various SCSI devices such as a CD-ROM drive, tape drive, etc.

The non-volatile memory 28 may include various removable/non-removable, volatile/nonvolatile computer storage media, such as hard disk drives that reads from or writes to non-removable, nonvolatile magnetic media, a magnetic disk drive that reads from or writes to a removable, nonvolatile magnetic disk, an optical disk drive that reads from or writes to a removable, nonvolatile optical disk such as a CD ROM or other optical media. Other removable/non-removable, volatile/nonvolatile computer storage media that can be used in the exemplary operating environment include, but are not limited to, magnetic tape cassettes, flash memory cards, digital versatile disks, digital video tape, solid state RAM, solid state ROM, and the like.

A user may enter commands and information into the computer through input devices connected to the user input interface 31. Examples of input devices include a keyboard and pointing device, mouse, trackball or touch pad. Other input devices may include a microphone, joystick, game pad, satellite dish, scanner, etc.

The computer 11 may operate in a networked environment via connections to one or more remote computers, such as a remote computer 48. The remote computer may comprise a personal computer (PC), server, router, network PC, peer device or other common network node, and typically includes many or all of the elements described supra. Such networking environments are commonplace in offices, enterprise-wide computer networks, intranets and the Internet.

When used in a LAN networking environment, the computer 11 is connected to the LAN 44 via network interface 42. When used in a WAN networking environment, the computer 11 includes a modem 40 or other means for establishing communications over the WAN, such as the Internet. The modem 40, which may be internal or external, is connected to the system bus 26 via user input interface 31, or other appropriate mechanism.

The computing system environment, generally referenced 10, is an example of a suitable computing environment and is not intended to suggest any limitation as to the scope of use or functionality of the invention. Neither should the computing environment be interpreted as having any dependency or requirement relating to any one or combination of components illustrated in the exemplary operating environment.

In one embodiment, the software adapted to implement the system and methods of the present invention can also reside in the cloud. Cloud computing provides computation, software, data access and storage services that do not require end-user knowledge of the physical location and configuration of the system that delivers the services. Cloud computing encompasses any subscription-based or pay-per-use service and typically involves provisioning of dynamically scalable and often virtualized resources. Cloud computing providers deliver applications via the internet, which can be accessed from a web browser, while the business software and data are stored on servers at a remote location.

In another embodiment, software adapted to implement the system and methods of the present invention is adapted to reside on a computer readable medium. Computer readable media can be any available media that can be accessed by the computer and capable of storing for later reading by a computer a computer program implementing the method of this invention. Computer readable media includes both volatile and nonvolatile media, removable and non-removable media. By way of example, and not limitation, computer readable media may comprise computer storage media and communication media. Computer storage media includes volatile and nonvolatile, removable and non-removable media implemented in any method or technology for storage of information such as computer readable instructions, data structures, program modules or other data. Computer storage media includes, but is not limited to, RAM, ROM, EEPROM, flash memory or other memory technology, CD-ROM, digital versatile disks (DVD) or other optical disk storage, magnetic cassettes, magnetic tape, magnetic disk storage or other magnetic storage devices, or any other medium which can be used to store the desired information and which can be accessed by a computer. Communication media typically embodies computer readable instructions, data structures, program modules or other data such as a magnetic disk within a disk drive unit. The software adapted to implement the system and methods of the present invention may also reside, in whole or in part, in the static or dynamic main memories or in firmware within the processor of the computer system (i.e. within microcontroller, microprocessor or microcomputer internal memory).

Other digital computer system configurations can also be employed to implement the system and methods of the present invention, and to the extent that a particular system configuration is capable of implementing the system and methods of this invention, it is equivalent to the representative digital computer system of FIG. 1 and within the spirit and scope of this invention.

Once they are programmed to perform particular functions pursuant to instructions from program software that implements the system and methods of this invention, such digital computer systems in effect become special purpose computers particular to the method of this invention. The techniques necessary for this are well-known to those skilled in the art of computer systems.

It is noted that computer programs implementing the system and methods of this invention will commonly be distributed to users on a distribution medium such as floppy disk, CDROM, DVD, flash memory, portable hard disk drive, etc. From there, they will often be copied to a hard disk or a similar intermediate storage medium. When the programs are to be run, they will be loaded either from their distribution medium or their intermediate storage medium into the execution memory of the computer, configuring the computer to act in accordance with the method of this invention. All these operations are well-known to those skilled in the art of computer systems.

The flowchart and block diagrams in the figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or by combinations of special purpose hardware and computer instructions.

Figure 2:
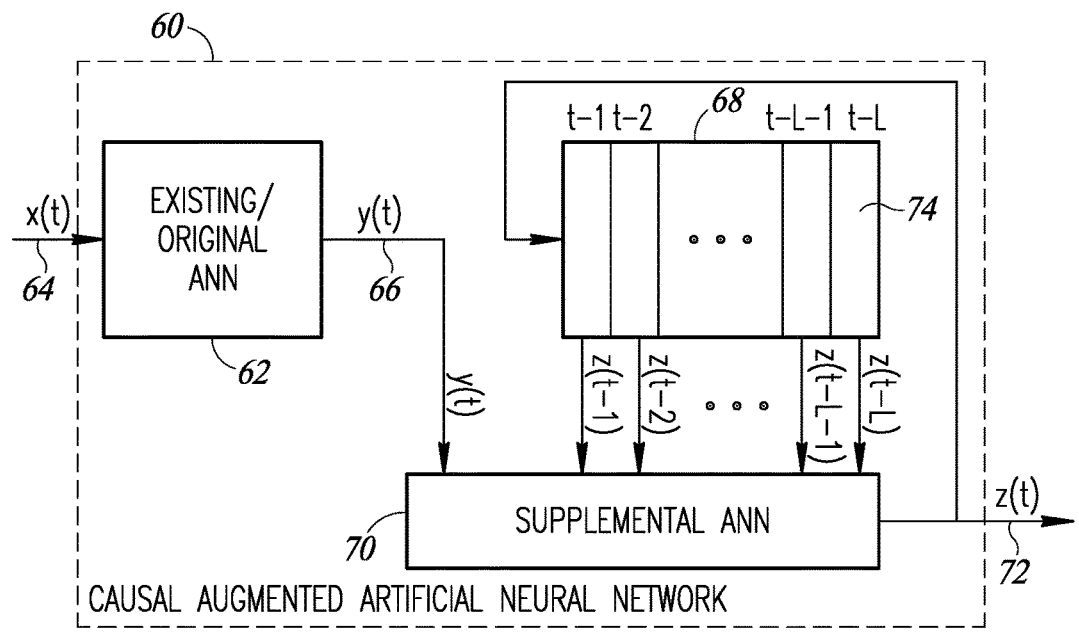
FIG. 2 is a diagram illustrating an example causal augmented artificial neural network (ANN) incorporating a supplemental ANN.

A diagram illustrating an example causal augmented artificial neural network (ANN) incorporating a supplemental ANN is shown in FIG. 2. The augmented ANN, generally referenced 60, comprises an existing ANN 62 configured to receive an input x(t) 64 and generate an output vector y(t) 66 (i.e. inferences), a supplemental ANN 70 adapted to receive the output y(t) and to generate an output z(t) 72, and a shift register 68 whose outputs are input to the supplemental ANN.

In one embodiment, the shift register 68 comprises a first-in first-out (FIFO) stack (or delay stack, history buffer, etc.) consisting of a plurality of registers 74. Each register is configured to store the output z(t) of the supplemental ANN. The current value of z(t) output of the supplemental ANN is input to the t−1 register. An integer number of registers L is provided. Thus, the stack holds output 'z' values from time t−1 through time t−L. As each successive value of z(t) is generated, the current values in the FIFO stack are shifted to the adjacent register to the right. Thus, the value stored in the t−1 register is shifted to the right and stored in the t−2 register, and so on through to the t−L register where the value shifted out is dropped. In one embodiment, the input to the supplemental ANN thus comprises the current output y(t) from the existing ANN as well as L historical values of z(t), namely z(t−1) through z(t−L).

Consider an example input x(t) comprising a video stream which typically carries a large amount of redundant information as changes from one frame to another are incremental in nature. Data compression algorithms take advantage of this to compress video streams, e.g., MPEG-4 incorporating H.264 compression.

In a typical video stream, consecutive frames tend to carry the same set of objects. Exceptions to this include scene changes, footage intentionally created to defy this property, etc. In addition, the location of the various objects in a frame tend to move quite smoothly around the frame going in or out of sight, while obeying real-world physical kinematic rules. Typical video frame rates are much higher than the typical speed of the objects within it.

Typical prior art networks, take into account the fact that a video is present at their input and are therefore designed to treat the input stream as a video stream upfront. These prior art image classification and detection neural networks operate frame-by-frame to extract and output estimates of the type of objects and their locations (also referred to as 'bounding boxes'). Note that the combination of object type and location is referred to as the 'output vector' of the network.

In one embodiment, the present invention exploits the redundant nature of information in a video stream to provide a mechanism that augments an existing ANN. The existing ANN typically operates on static images, i.e. frame by frame in the context of a video input feed, in a computational and memory efficient manner. The addition of the supplemental ANN along with the FIFO stack 68 operative to store historical values of the output enables the resultant augmented network to look back into the past in making a decision for the current frame. This provides a filtering function which effectively smooths the output of the network. In addition, the mechanism of the present invention does not require any special training other than the original training for the existing ANN nor does it require labeling of the data set. Thus, the mechanism avoids the intensive task of retraining the entire neural network.

Thus, the mechanism of the present invention introduces time domain related aspects at the output of the network thereby removing the complexity of treating the input data stream as a video feed. In one embodiment, this is achieved by using the information extracted from previous frames to evaluate the information in the current frame in a proper context.

In this manner, an object that was present at time 't' will reinforce the likelihood for its presence to be detected at time t+1. This is achieved systematically through neural network primitives rather than heuristic rule based reasoning. The existing ANN is augmented with an additional layer (i.e. the supplemental ANN 70) that combines the output of the network from time t−1 to t−L. This additional set is relatively small and can be trained using the same training set as the original ANN. Furthermore, its initialization can be easily defined at a starting point that does not impede any original network decisions.

Thus, for existing ANNs that perform feature extraction only (i.e. a classifier network), utilizing historical output information, the augmented ANN provides object tracking and output result smoothing. In general, using historical output enables the augmented ANN to leverage correlations between different objects in different frames at different time steps. Examples include object motion tracking, interaction amongst objects, etc.

To this end, once the supplemental ANN 70 is trained it gains knowledge concerning the physically plausible relationships between detected objects in a video. Thus, relationships that are physically plausible are 'favored' over those which are less likely.

Typically, a range for the depth L of the history buffer from 5 to 10 is sufficient to improve detection accuracy, improve the stability of detection over time for a video image stream, and to smooth the detection of objects in the stream. This smoothing feature functions to lower the overall error rate of the augmented ANN.

Maximum benefit of the present invention is achieved when the existing ANN performs both a classification and localization function. The output y(t) of the existing ANN typically varies over time. The augmented ANN functions to not only improve the classification of objects but to also track their motion from one frame to the next. For example, objects that are detected in a frame but suddenly disappear in the next frame but reappear in the subsequent frame are suspect for misdetection. By using its historical knowledge of the detected objects, the supplemental ANN can spot the misdetection and correct it.

Two requirements for constructing the supplemental ANN include (1) knowledge of the output vector y(t), e.g., in the case of video, the number of entries related to the number of objects to be tracked; (2) the size of L, i.e. the depth for the historical buffer. Note that L can be either static or dynamic.

In the static L case, the value of L depends on the expected dynamic range of the input x(t). If the dynamic range for L is low, than L can be set to a lower number. If it is desired to look back over a long period of time, than L should be set to a higher value. For example, consider an input stream of text where it is desired to detect either words or sentences. To detect sentences, a deeper history buffer is required than if just detecting words, thus a higher value of L is required.

In the case of a dynamic L, the value of L can be determined during the training of the supplemental ANN using a closed loop to arrive at an optimal value based on a loss function. A cost function (or metric) can be used where the value is changed from a starting value (e.g., one or a random value) using back propagation. The value of L is considered like another weight and is modified at each cycle. It is preferable, however, to reduce the modification rate for L to slower than the other weights (e.g., 100 times slower) to improve convergence.

It is noted that the supplemental ANN may comprise any neural network, e.g., multilayer perceptrons (MLP), convolutional neural networks (CNN), etc. Coupling a history buffer to the supplemental ANN enables it to look not only within a particular feature or object, but across features and objects in multiple frames (e.g., for video input). This ability is not possible using the existing ANN by itself. The history buffer can be shallow or deep depending on the nature of the input data.

It is noted that while the above is discussed for an input comprising a video stream represented by a sequence of frames over time, the invention is neither limited to input video nor to time domain based input. While video is a very common use case, the mechanism of the present invention can be applied to any ordered sequence of inputs (e.g., a sequence of audio samples, a set of responses to questions that are presented in a given order, a sequence of text, frequency domain signals, etc.).

Figure 3:
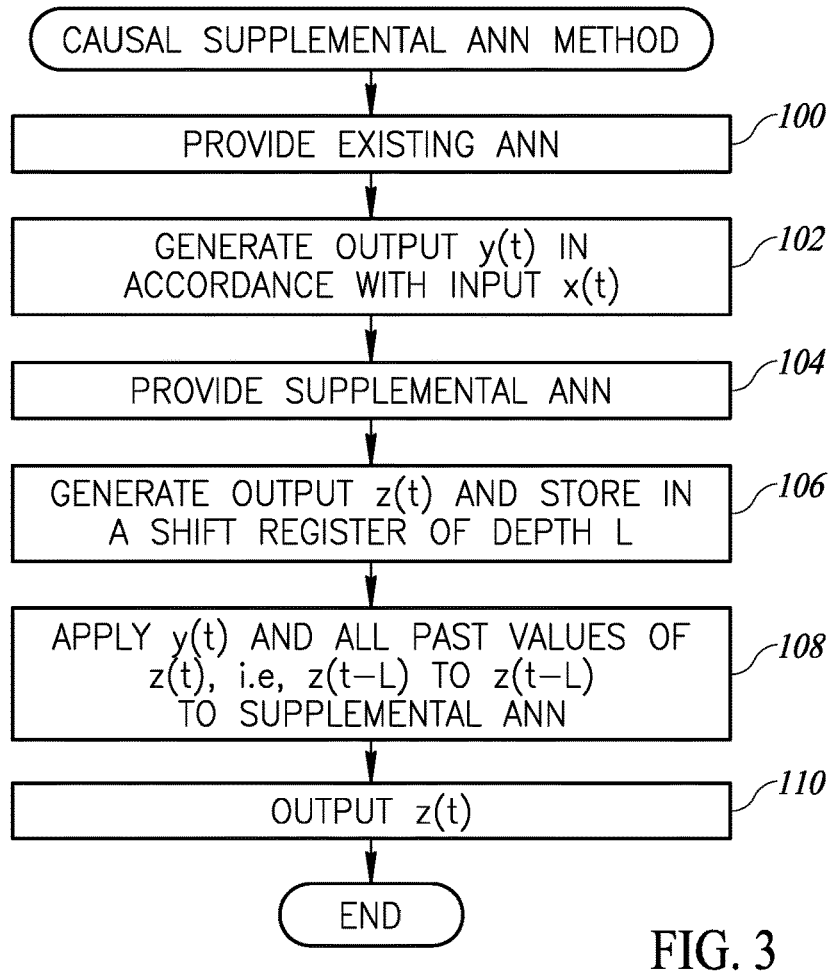
FIG. 3 is a flow diagram illustrating an example causal supplemental ANN method.

A flow diagram illustrating an example lookahead supplemental ANN method is shown in FIG. 3. An existing ANN is provided (step 100). Typically, this is generated and provided by a user. The existing ANN is trained using the original training data set. Neither a new training set nor labeling of the data set is required for use with the mechanism of the invention. The existing ANN functions to generate an output vector y(t) in accordance with an input x(t) (step 102). A supplemental ANN is generated and provided (step 104). The supplemental ANN is operative to generate an output z(t) and store it in a history buffer (i.e. shift register) having a depth L (step 106). The current output y(t) and past values of z(t), namely z(t−1) through z(t−L) are applied as input to the supplemental ANN (step 108). The current output of the supplemental ANN z(t) comprises the output of the system (step 110).

The augmented neural network illustrated in FIG. 2 is a causal system. For systems that can tolerate some latency, a lookahead (or 'non-causal') system can be used. A lookahead augmented ANN employs a lookahead function as well as past history which results in a more robust output. Note that the term 'non-causal' is used herein with respect to the current output (what is indicated as time 't' in the Figures). The system is actually causal since it is a real-world system. Latency is intentionally introduced to create an artificial 'non-causal' system with lookahead capabilities.

For example, in the case of video input, both past video frames as well as 'future' video frames are used in calculating a current output. This is effectively a 'glimpse into the future' which is used to correct and compensate for any over-damping tendencies of the causal system described supra.

Figure 4:
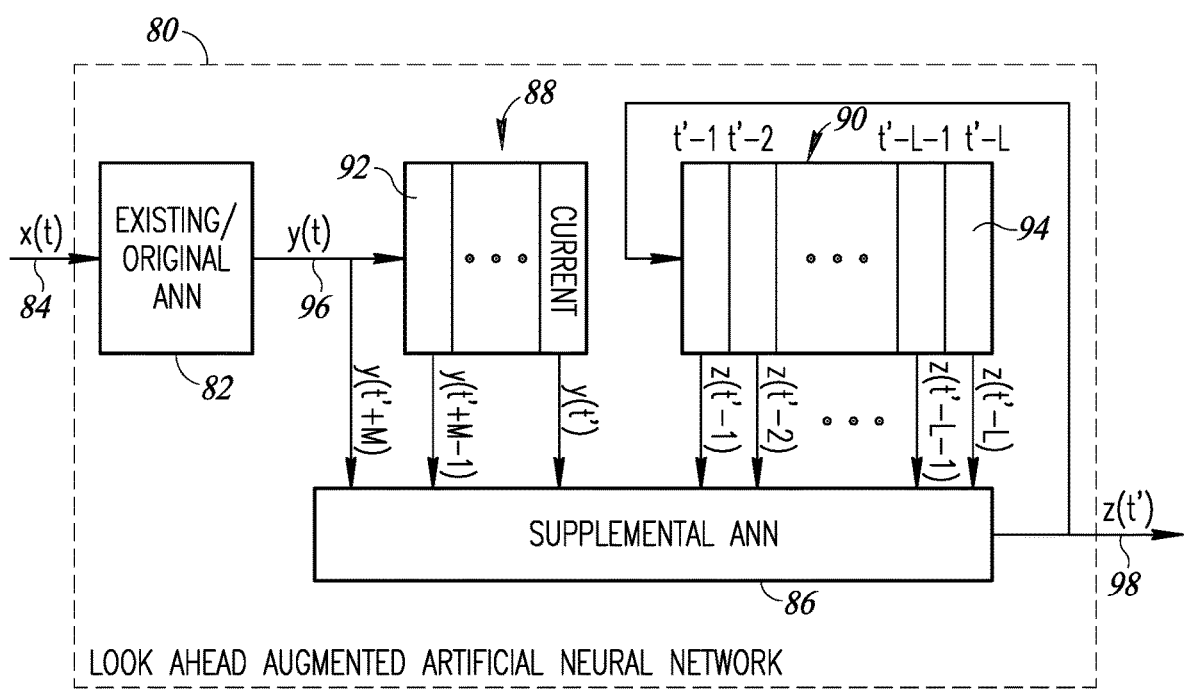
FIG. 4 is a diagram illustrating an example lookahead ANN incorporating a supplemental ANN.

A diagram illustrating an example lookahead ANN incorporating a supplemental ANN is shown in FIG. 4. The augmented ANN, generally referenced 80, comprises an existing ANN 82 configured to receive an input x(t) 84 and generate an output vector y(t) 96 (i.e. inferences), a supplemental ANN 86 adapted to receive the output y(t) and to generate an output z(t) 98, shift registers 88 and 90 whose outputs are input to the supplemental ANN.

In one embodiment, the shift registers 88, 90 comprise a first-in first-out (FIFO) stack (or delay stack, history buffer, etc.) consisting of a plurality of registers 92, 94, respectively. Each register 94 is configured to store the output z(t') of the supplemental ANN. The current value of z(t') output of the supplemental ANN is input to the t'−1 register. Note that t'=t−M, where M−1 is the depth of the y(t) shift register (i.e. history buffer) 88. History buffer 90 comprises an integer number of registers L. Thus, the history buffer stores output 'z' values from time t'−1 through time t'−L.

Similarly, each register 92 of history buffer 88 is configured to store the output y(t) of the existing ANN. The current value of y(t) output of the existing ANN is input to the t'+M−1 register. History buffer 88 comprises an integer number of registers M−1. Thus, the history buffer stores output 'y' values from time t'+M−1 through time t'. The t' slot in the history buffer (i.e. the last register) is considered the new 'current' output value y(t'). Therefore, the history buffer 88 stores M−1 'future' values of y(t).

In one embodiment, the input to the supplemental ANN thus comprises the new 'current' output y(t'), M−1 'future' values of y(t), namely y(t'+1) through y(t'+M) from the existing ANN, as well as L past values of z(t), namely z(t−1) through z(t−L) from the supplemental ANN. The augmented ANN is operative to calculate a decision with reference to the new 'current' output value y(t') while looking at not only past output history as in the causal system described supra, but while also looking at 'future' output values of the existing ANN.

Note that the invention is not limited to storing every output generated by the existing and supplemental ANNs in a history buffer. Frame reference (in the case of video input) can be diluted on the frame delta. Looking forward into the future and back into the past does not necessarily need to be exactly one frame. N frames can be used, thereby representing a frame skipping rate 1/N or alternatively a batch of N frames can be averaged over time. In addition, L can be made a value that is learned over time assuming that the training data set carries the same dynamic nature as the eventual observed data. In this case, L becomes an estimate of the dynamics of the objects in the data input.

For example, in some embodiments, output values may be skipped, e.g., every second frame, every third frame, every $N^{th}$ frame. For example, in the case of an input video stream, each output z(t) may be stored in the history buffer thus making each register 74 represent one frame or 1/30 second. Alternatively, every third output z(t) value (N=3) may be stored in the history buffer thus making each register 74 represent three frames or 1/10 second.

Similar to the system 60 (FIG. 2), once the supplemental ANN 86 is trained it gains knowledge concerning the physically plausible relationships between detected objects in a video. Thus, relationships that are physically plausible are 'favored' over those which are less likely.

Figure 5:
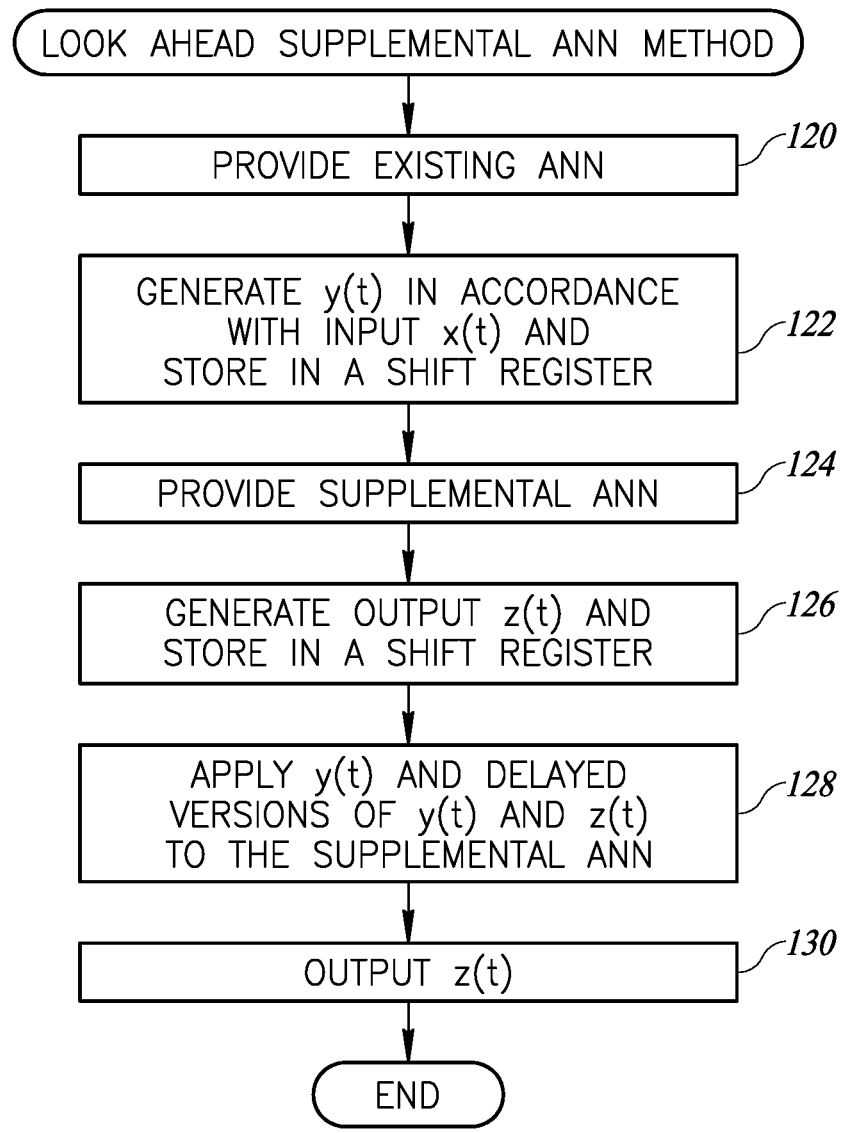
FIG. 5 is a flow diagram illustrating an example lookahead supplemental ANN method.

A flow diagram illustrating an example lookahead supplemental ANN method is shown in FIG. 5. An existing ANN is provided (step 120). Typically, this is generated and provided by a user. The existing ANN is trained using the original training data set. A new training set is not required for use with the mechanism of the invention. The existing ANN functions to generate an output vector y(t) in accordance with an input x(t) and store it in a history buffer (i.e. shift register) having a depth M−1 (step 122). This creates the 'future' values for use in calculating output values. A supplemental ANN is generated and provided (step 124). The supplemental ANN is operative to generate an output z(t) and store it in a history buffer (i.e. shift register) having a depth L (step 126). 'Future' values of y(t), namely y(t') through y(t'+M) as well as past values of z(t'), namely z(t'−1) through z(t'−L) are applied as input to the supplemental ANN (step 128). The output of the supplemental ANN z(t') comprises the output of the system (step 130).

Figure 6A:
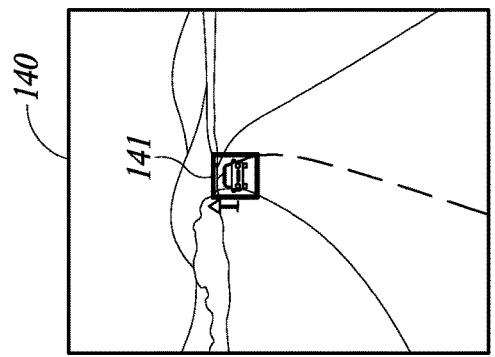
FIG. 6A is a diagram illustrating a first example video stream without the augmented ANN of the present invention.
Figure 6A:
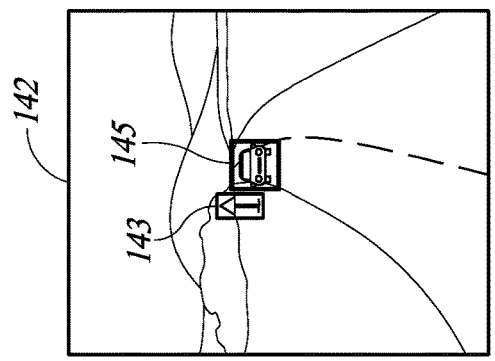
Figure 6A:
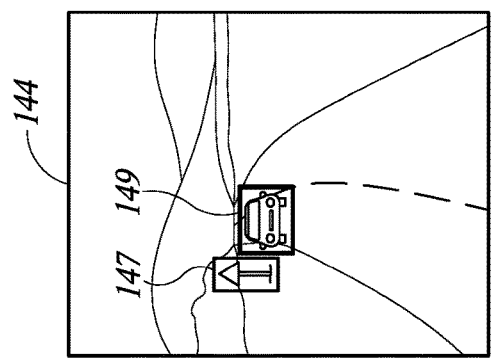
Figure 6A:
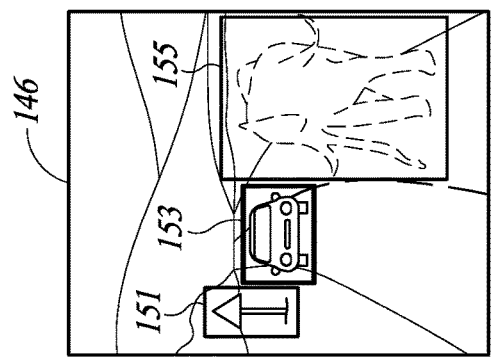

A diagram illustrating a first example video stream without the augmented ANN of the present invention is shown in FIG. 6A. Several video frames are shown along with detected objects. Frame 140 depicts a road scene with a bounding box 141 placed around a detected road sign. Frame 142 depicts a bounding box 143 around the road sign which is a bit bigger now as well as a bounding box 145 around a truck. Frame 144 shows a bounding box 147 around the road sign which is bigger now and a bounding box 149 around the truck which is a bit bigger. The fourth frame 146 shows a bounding box 151 around the road sign, a bounding box 153 around the truck, and a bounding box 155 around an elephant which is drawn dotted since it is not really in the scene. The existing ANN processing the video mistakenly determined that an elephant suddenly appeared and placed a bounding box around it. It is virtually impossible, however, for an elephant to suddenly appear in the video frame.

The augmented ANN of the present invention is operative to correct for this mistake. Using past history, the augmented ANN is operative to inherently learn the likelihood of the combined presence of certain objects and in certain proportions. Therefore, the augmented ANN down scores unlikely combinations of objects thereby lowering overall detection error. This is achieved by applying weights not just for individual features but across multiple features as well. For example, there would be weights for the detection of combinations of objects not just in an individual frame from across frames by using the historical data available to the supplemental ANN. This enables the augmented network to reduce or eliminate false detections and to correct for misdetections.

Figure 6B:
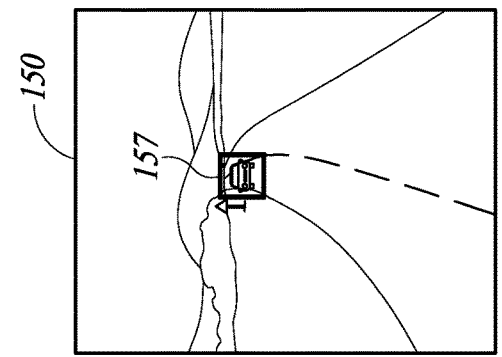
FIG. 6B is a diagram illustrating the first example video stream with the augmented ANN of the present invention.
Figure 6B:
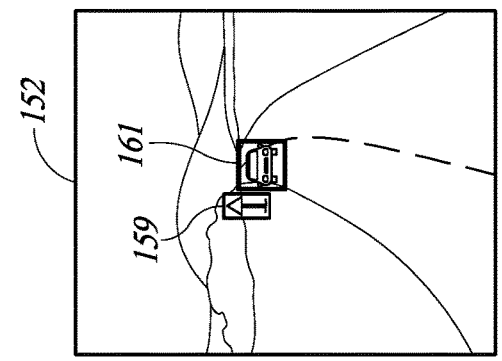
Figure 6B:
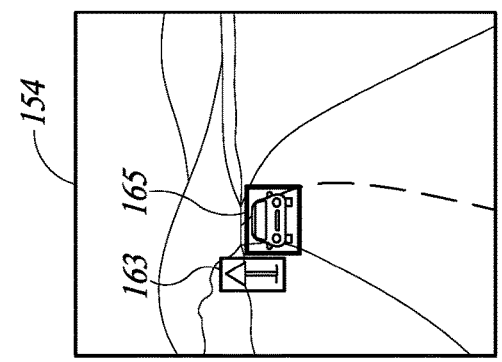
Figure 6B:
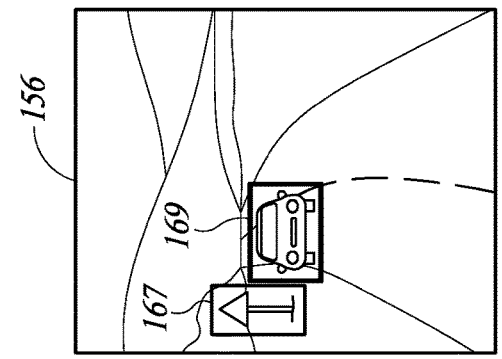

A diagram illustrating the first example video stream with the augmented ANN of the present invention is shown in FIG. 6B. The same video frames as in FIG. 6A are processed by the augmented ANN. Frame 150 depicts a road scene with a bounding box 157 placed around a detected truck. Frame 152 depicts a bounding box 159 around the road sign which is a bit bigger now as well as a bounding box 161 around a truck. Frame 154 shows a bounding box 163 around the road sign which is bigger now and a bounding box 165 around the truck which is a bit bigger. The fourth frame 156 shows a bounding box 167 around the road sign and a bounding box 169 around the truck. Here, however, the augmented ANN correctly does not detect an elephant as in frame 146 (FIG. 6A) since it is not actually in the frame.

Figure 7A:
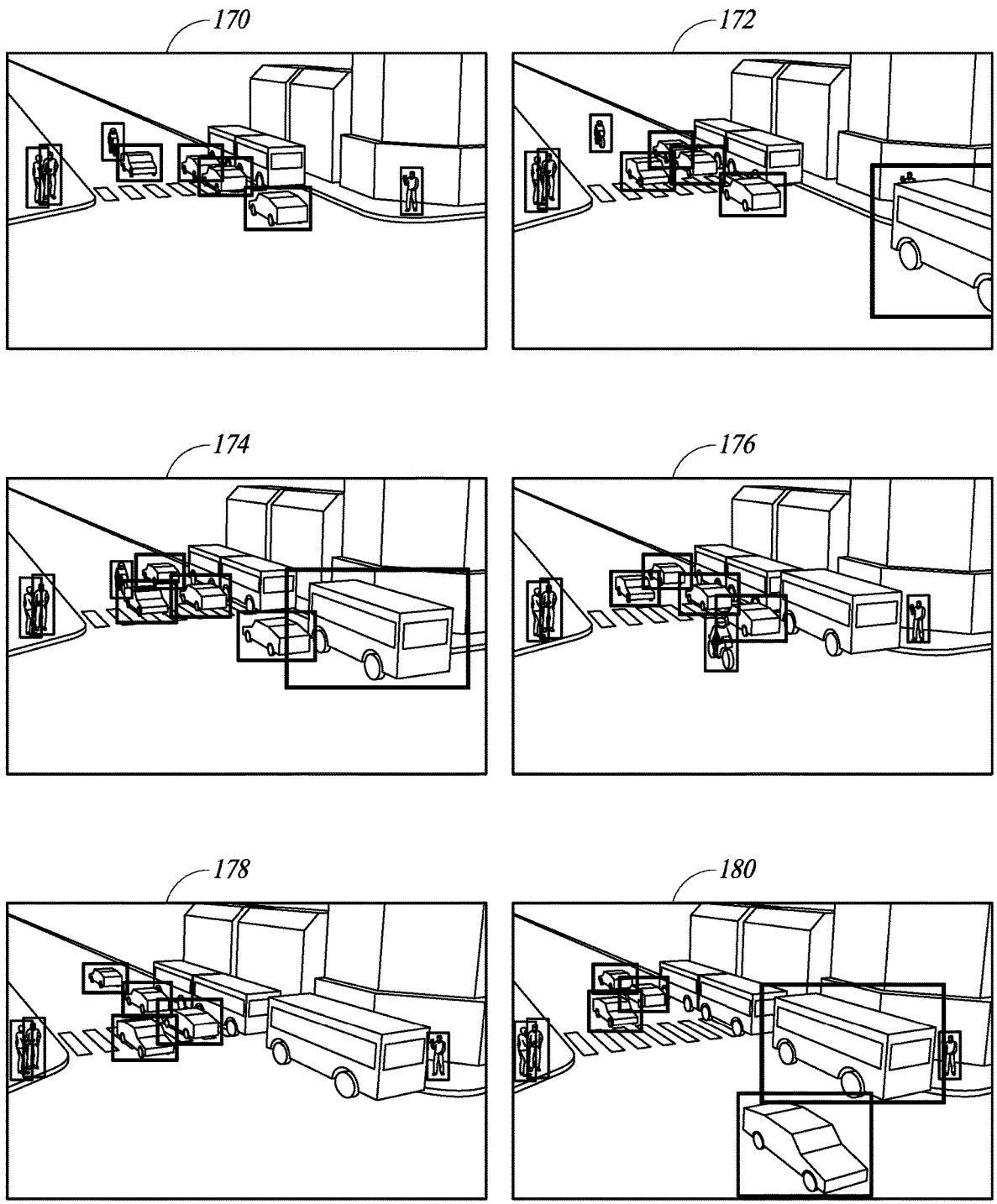
FIG. 7A is a diagram illustrating a second example video stream without the augmented ANN of the present invention.

A diagram illustrating a second example video stream without the augmented ANN of the present invention is shown in FIG. 7A. The video frames shown here are another example of how the underlying ANN model is expressed through evolving changes in the image over time. Since these changes in the images obey physical laws, a change that occurs too suddenly is impossible and the model rejects it.

Frames 170, 172, 174, 176, 178, and 180 depict a street scene view at an intersection. Various pedestrians, car, motorbike, and bus objects are detected. In particular, a large bus object on the right is detected in frames 172, 174, and 180. The existing ANN fails to detect the bus in frames 176 and 178. It is impossible, however, that the bus could appear in one frame and actually disappear in a consecutive frame as physical laws prevent this from occurring.

Similarly, the existing ANN fails to detect the smaller bus in the middle of frame 172 even though it is detected in the previous frame 170. A bus cannot defy the laws of physics and suddenly appear in a frame. Thus, the failure to detect the bus in frame 172 is a detection error.

Figure 7B:
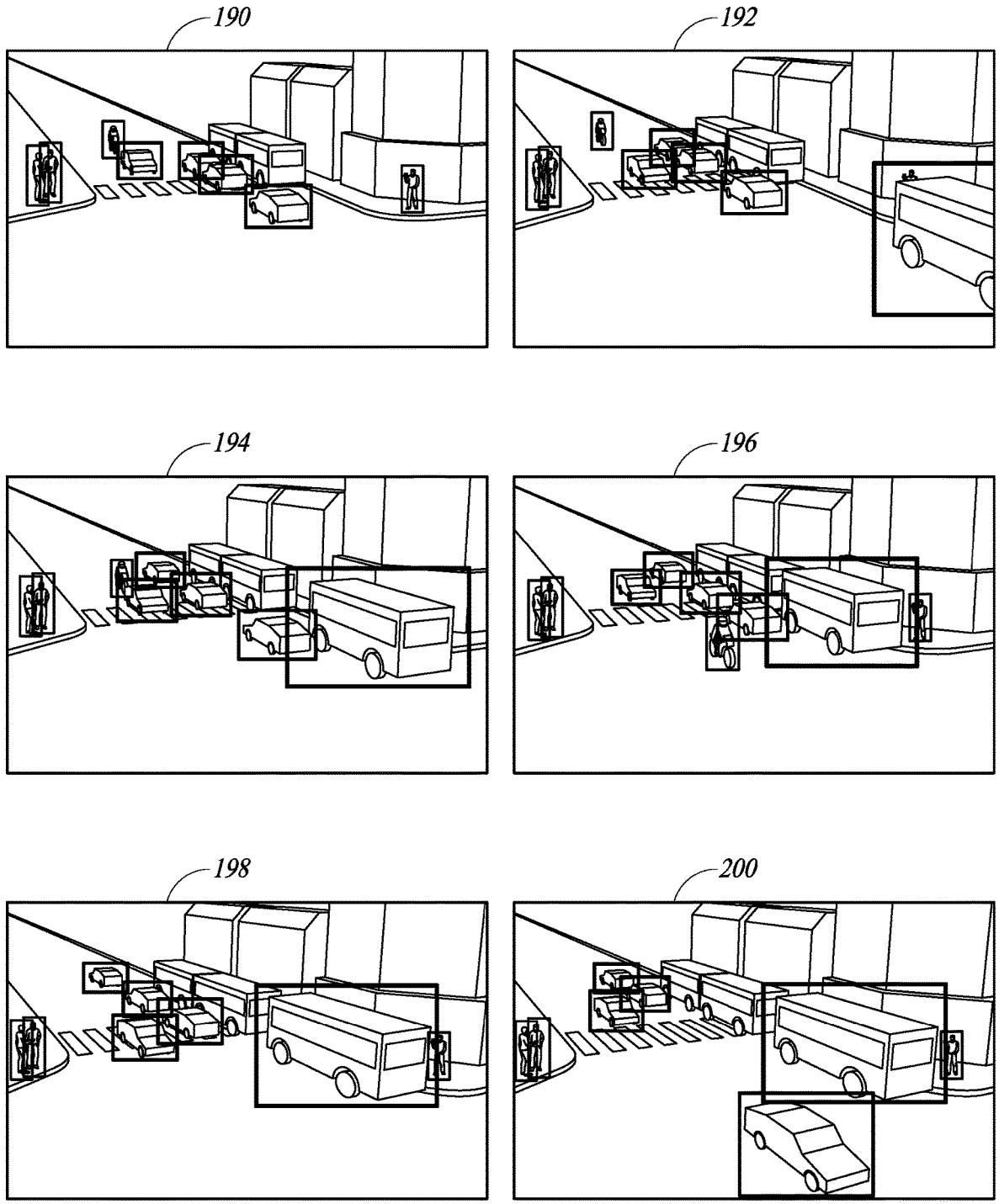
FIG. 7B is a diagram illustrating the second example video stream with the augmented ANN of the present invention.

The augmented ANN of the present invention takes advantage of knowledge of the past in making a decision for the current frame. Thus, the augmented ANN correctly detects the bus object in all frames in which it is present. A diagram illustrating the second example video stream with the augmented ANN of the present invention is shown in FIG. 7B. Frames 190, 192, 194, 196, 198, and 200 depict the same street scene as in FIG. 7A. The difference here is that the augmented ANN, utilizing past history, detects the bus in frames 196 and 198 thus avoiding the misdetection when using the existing ANN alone. In addition, using historical output, the augmented ANN correctly detects the smaller bus in the middle of frame 192.

Figure 8A:
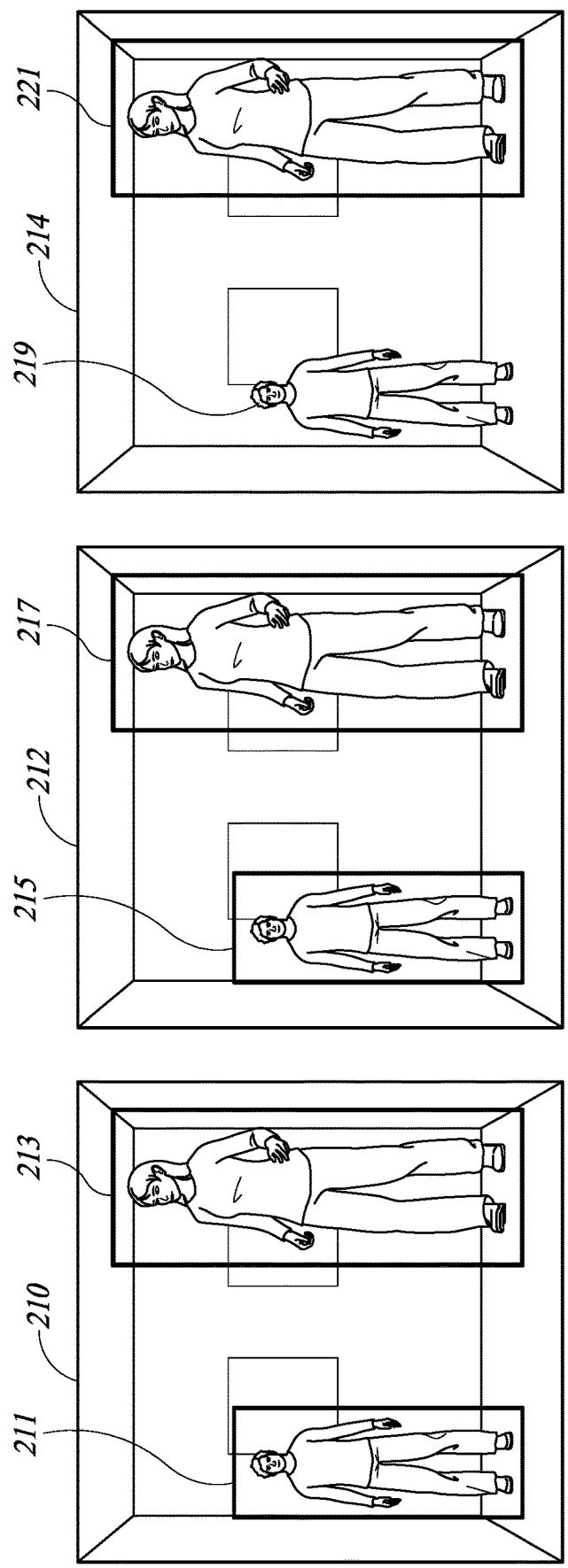
FIG. 8A is a diagram illustrating a third example video stream without the augmented ANN of the present invention.

A diagram illustrating a third example video stream without the augmented ANN of the present invention is shown in FIG. 8A. In this example video stream, three frames 210, 212, 214 are shown with two people in each frame. In frame 210 a bounding box 211 is placed around the person on the left, and a bounding box 213 is placed around the person on the right. In frame 212 a bounding box 215 is placed around the person on the left, and a bounding box 217 is placed around the second person on the right. In frame 214 a bounding box 221 is placed around the person on the right but the existing ANN fails to detect the person 219 on the left. This the case where the object (i.e. the person on the left) is mistakenly misdetected due to marginal detection.

Figure 8B:
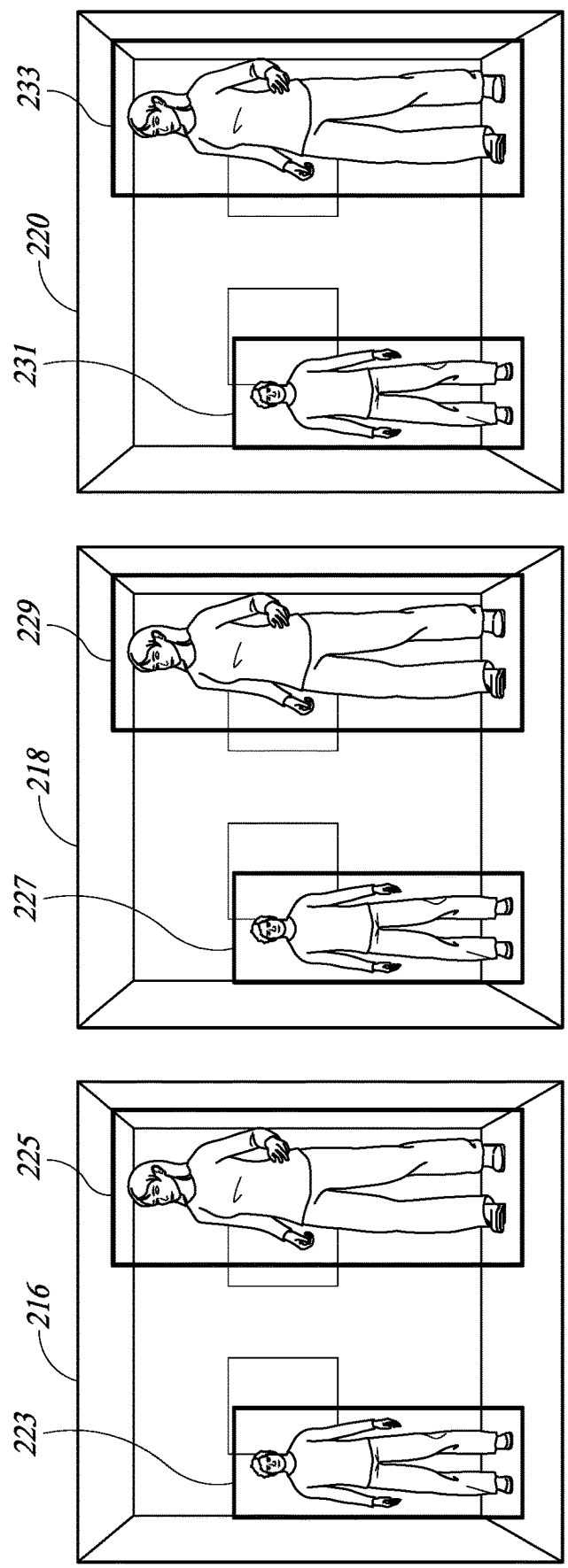
FIG. 8B is a diagram illustrating the third example video stream with the augmented ANN of the present invention.

Leveraging past historical output data, the augmented ANN yields improved likelihood for the overall detection. Thus, if an object suddenly disappears and the previous frames indicate it should be present, the system will 'decay' the misdetection and detect the object. An example of this is presented in FIG. 8B.

The same video is shown in frames 216, 218, 220 which depict two people in each frame. In frame 216 a bounding box 223 is placed around the person on the left, and a bounding box 225 is placed around the person on the right. In frame 218 a bounding box 227 is placed around the person on the left, and a bounding box 229 is placed around the second person on the right. In frame 220 a bounding box 233 is placed around the person on the right and a bounding box 231 is placed the person on the left.

Figure 9:
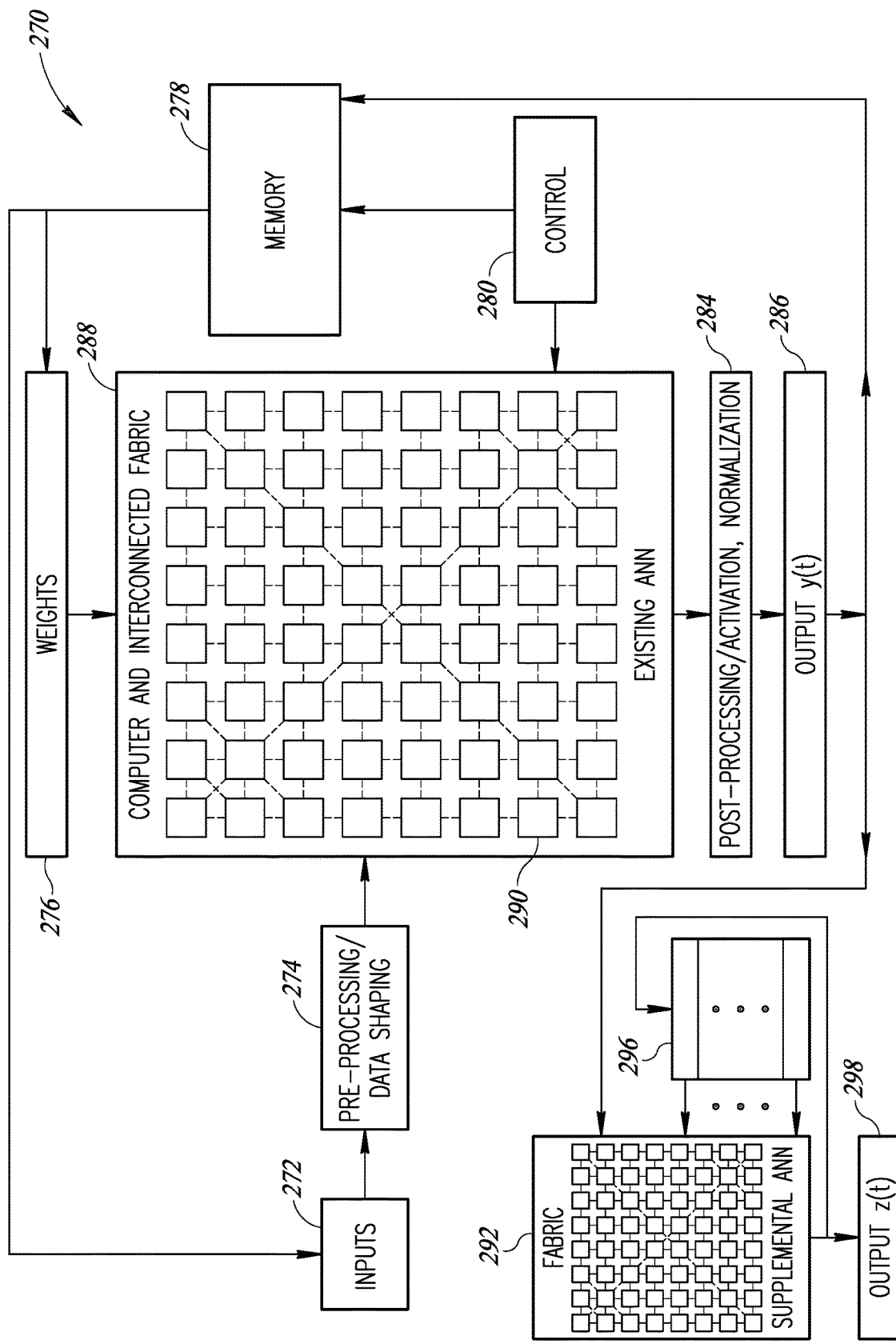
FIG. 9 is a block diagram illustrating an example integrated circuit device implementing the augmented ANN of the present invention incorporating the supplemental ANN.

A block diagram illustrating an example integrated circuit device implementing the augmented ANN of the present invention incorporating the supplemental ANN is shown in FIG. 9. The device, generally referenced 270, comprises a control block 280 incorporating logic circuitry, memory block 278, inputs 272, pre-processing/data shaping block 274, weights block 276, computer and interconnected fabric 288, computational elements 290, post-processing/activation, normalization block 284, and output y(t) block 286.

The device 270 describes a generalized version of a device that efficiently implements a neural network. It comprises an array of computational elements 288 (i.e. the fabric). Note that these elements are either physical or virtual entities that implement the mathematical computation required to obtain a desired output from the neural network.

The computational elements use two sets of data points, the inputs 272 and the weights 276 retrieved from memory 278. The inputs may be subject to pre-processing via block 274 and the outputs may be subject to post-processing via block 284.

A control entity 280 is operative to orchestrate the overall execution of the device by triggering data retrieval of inputs and weights from memory to the compute fabric 288, as well as triggering the execution of the compute fabric.

Note that in the context of the present invention, the components that are adapted to implement the invention may or may not participate in execution of the device, depending on the actual implementation.

In accordance with one embodiment of the present invention, the device 270 also comprises a supplemental ANN 292, output history buffer 296, and output z(t) 298. In operation, the existing ANN is implemented in the fabric 288. It is augmented by the supplemental ANN 292. Note that while the example shown is a causal network, it is appreciated that a lookahead network can also be implemented as described in detail supra in connection with FIG. 4.

In one embodiment, as shown in FIG. 9, block 288 comprises the existing ANN while the supplemental ANN 292 and related history buffer 296 is implemented using a separate hardware fabric which comprises a similar computer and interconnect fabric as in block 288.

Alternatively, the existing ANN as well as the supplemental ANN and related history buffer 296 share the same hardware fabric 288 (not shown). In this case, the hardware fabric of block 288 is split into two portions, i.e. existing and supplemental ANN portions.

In either case, the control block 280 is adapted to configure the hardware so as to implement the causal and lookahead augmented ANNs.

Note that any machine that possesses the capability to implement the existing ANN is capable of implementing the supplemental ANN. In one embodiment, the same mechanism can be used for both. In addition, given sufficient resources are available to accommodate both the existing and supplemental ANN, both can implemented in a single device.

Alternatively, since the bandwidth is reduced at the output of the existing ANN, the existing and supplemental ANN may be implemented using separate devices whereby one device feeds its output into the input of the subsequent device.

Those skilled in the art will recognize that the boundaries between logic and circuit blocks are merely illustrative and that alternative embodiments may merge logic blocks or circuit elements or impose an alternate decomposition of functionality upon various logic blocks or circuit elements. Thus, it is to be understood that the architectures depicted herein are merely exemplary, and that in fact many other architectures may be implemented which achieve the same functionality.

Any arrangement of components to achieve the same functionality is effectively "associated" such that the desired functionality is achieved. Hence, any two components herein combined to achieve a particular functionality may be seen as "associated with" each other such that the desired functionality is achieved, irrespective of architectures or intermediary components. Likewise, any two components so associated can also be viewed as being "operably connected," or "operably coupled," to each other to achieve the desired functionality.

Furthermore, those skilled in the art will recognize that boundaries between the above described operations merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

In the claims, any reference signs placed between parentheses shall not be construed as limiting the claim. The use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first," "second," etc. are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. As numerous modifications and changes will readily occur to those skilled in the art, it is intended that the invention not be limited to the limited number of embodiments described herein. Accordingly, it will be appreciated that all suitable variations, modifications and equivalents may be resorted to, falling within the spirit and scope of the present invention. The embodiments were chosen and described in order to best explain the principles of the invention and the practical application, and to enable others of ordinary skill in the art to understand the invention for various embodiments with various modifications as are suited to the particular use contemplated.

What is claimed is:

1. An apparatus for augmenting an existing artificial neural network (ANN), comprising:
 a first circuit in a neural network processor integrated circuit (IC) operative to implement said existing ANN, said existing ANN operative to receive single static frames of input data and to generate a first output therefrom on a static frame by frame basis;

a second circuit in said neural network processor IC operative to implement a supplemental artificial neural network, said supplemental ANN operative to receive said first output of the existing ANN and to generate a second output;

a plurality of shift registers organized as a first-in first-out (FIFO) circuit in said neural network processor IC and operative to receive said second output from said supplemental ANN and to generate a plurality of historical values from said second output therefrom; and wherein said supplemental ANN is configured to generate said second output based on the first output of the existing ANN and said plurality of historical values of said second output thereby enabling an augmented neural network consisting of said existing ANN and said supplemental ANN to utilize past static frames of input data in generating decisions for a current input frame without requiring retraining of said existing ANN.

2. The apparatus according to claim 1, wherein said augmented ANN does not require retraining over original training required for said existing ANN.

3. The apparatus according to claim 1, wherein a depth L of said plurality of shift registers is determined either statically or dynamically.

4. The apparatus according to claim 3, further comprising utilizing a closed loop to generate an optimal value of L in accordance with a loss function.

5. A method of augmenting an existing artificial neural network (ANN), comprising:

receiving single static frames of input data at a first circuit in a neural network processor integrated circuit (IC) operative to implement said existing ANN and generating a first output therefrom;

receiving said first output of said existing ANN at a second circuit in said neural network processor IC operative to implement a supplemental ANN and generating a second output therefrom;

generating a plurality of historical values of said second output of said supplemental ANN and storing them in a plurality of shift registers organized as a first-in first-out (FIFO) circuit in said neural network processor IC; and wherein said supplemental ANN is configured to receive as input the first output of the existing ANN and said plurality of historical values of said second output thereby enabling an augmented neural network consisting of said existing ANN and said supplemental ANN to utilize past static frames of input data in generating decisions for a current input frame without requiring retraining of said existing ANN.

6. The method according to claim 5, wherein said augmented ANN does not require retraining over original training required for said existing ANN.

7. The method according to claim 5, wherein a depth L of said plurality of historical values is determined either statically or dynamically.

8. An apparatus for augmenting an existing artificial neural network (ANN), comprising:

a first circuit in a neural network processor integrated circuit (IC) operative to implement said existing ANN, said existing ANN operative to receive single static frames of input data and to generate a first output therefrom;

a second circuit in said neural network processor IC operative to implement a supplemental artificial neural network, said supplemental ANN operative to receive said first output of the existing ANN, said supplemental ANN operative to generate a second output therefrom;

a first plurality of shift registers organized as a first first-in first-out (FIFO) circuit in said neural network processor (IC) and operative to receive a first output of the existing ANN and to generate a first plurality of historical values thereof, wherein said first FIFO is operative to introduce latency thereby effectively creating an artificial non-causal system with lookahead capabilities;

a second plurality of shift registers organized as a second FIFO circuit in said neural network processor IC and operative to receive said second output from said supplemental ANN and to generate a second plurality of historical values from said second output therefrom; and wherein said supplemental ANN is configured to receive as input the first output of the existing ANN, said first plurality of historical values of the first output, and said second plurality of historical values of said second output thereby enabling an augmented neural network consisting of said existing ANN and said supplemental ANN to utilize past static frames of input data in generating decisions for a current input frame without requiring retraining of said existing ANN.

9. The apparatus according to claim 8, wherein said supplemental ANN, said first plurality of shift registers, and said second plurality of shift registers comprise a lookahead system.

10. The apparatus according to claim 8, wherein a depth M of said first plurality of shift registers is determined either statically or dynamically, and wherein a depth L of said second plurality of shift registers is determined either statically or dynamically.

11. A method of augmenting an existing artificial neural network (ANN), comprising:

receiving single static frames of input data at a first circuit in a neural network processor integrated circuit (IC) operative to implement said existing ANN and generating a first output therefrom;

receiving said first output of said existing ANN at a second circuit in said neural network processor IC operative to implement a supplemental ANN and generating a second output therefrom;

generating a first plurality of historical values of said first output of said existing ANN and storing them in a first plurality of shift registers organized as a first first-in first-out (FIFO) circuit in said neural network processor IC;

generating a second plurality of historical values of said second output of said supplemental ANN and storing them in a second plurality of shift registers organized as a second FIFO circuit in said neural network processor IC; and wherein said supplemental ANN is configured to receive as input the first output of the existing ANN, said first plurality of historical values of the first output, and said second plurality of historical values of said second output thereby enabling an augmented neural network consisting of said existing ANN and said supplemental ANN to utilize past static frames of input data in generating decisions for a current input frame without requiring retraining of said existing ANN.

12. The method according to claim 11, wherein said supplemental ANN, said first plurality of historical values, and said second plurality of historical values comprise a lookahead system.

13. The method according to claim 11, wherein a depth M of said first plurality of historical values is determined either statically or dynamically, and wherein a depth L of said second plurality of historical values is determined either statically or dynamically.

14. A method for use with an existing artificial neural network (ANN), comprising:
- receiving single static frames of input data at a circuit in a neural network processor integrated circuit (IC) operative to implement said existing ANN and generating a first output therefrom;
- augmenting the existing ANN with an additional layer implemented in said circuit, said additional layer operative to implement a supplemental ANN;
- generating a plurality of historical values of an output of the supplemental ANN and storing them in a plurality of shift registers organized as a first-in first-out (FIFO) circuit in said neural network processor IC, thereby creating past values of the output of the supplemental ANN; and
- utilizing said historical values along with an output of the existing ANN to generate the supplemental ANN output thereby enabling an augmented neural network consisting of said existing ANN and said supplemental ANN to utilize past static frames of input data in generating decisions for a current input frame without requiring retraining of said existing ANN.

15. The method according to claim 14, wherein a depth L of said plurality of historical values is determined either statically or dynamically.

16. The method according to claim 14, wherein a combination of said existing ANN, said supplemental ANN, and the utilization of said plurality of historical values is operative to provide additional information that leverages correlations among different objects in different frames at different times.

17. A method for use with an existing artificial neural network (ANN), comprising:
- receiving single static frames of input data at a circuit in a neural network processor integrated circuit (IC) operative to implement said existing ANN and generating a first output therefrom;
- augmenting the existing ANN with an additional layer implemented in said circuit, said additional layer operative to implement a supplemental ANN;
- generating a first set of historical values of an output of the existing ANN and storing them in a first plurality of shift registers organized as a first first-in first-out (FIFO) circuit in said neural network processor IC, said first set of historical values adapted to provide a delayed version of the output of the existing ANN thereby creating future values of the output of the existing ANN;
- generating a second set of historical values of an output of the supplemental ANN and storing them in a second plurality of shift registers organized as a second FIFO circuit in said neural network processor IC thereby creating past values of the output of the supplemental ANN; and
- utilizing said past values of the output of the supplemental ANN and said future values of the output of the existing ANN to generate the supplemental ANN output thereby enabling an augmented neural network consisting of said existing ANN and said supplemental ANN to utilize past static frames of input data in generating decisions for a current input frame without requiring retraining of said existing ANN.

18. The method according to claim 17, wherein a depth M of said future values is determined either statically or dynamically, and wherein a depth L of said past values is determined either statically or dynamically.

19. The method according to claim 17, wherein utilization of a combination of said past values and said future values in determining the output of the supplemental ANN is operative to provide additional information that leverages correlations among different objects in different frames at different times.

* * * * *